United States Patent [19]

Perlman

[11] Patent Number: 5,377,207
[45] Date of Patent: Dec. 27, 1994

[54] MAPPINGS BETWEEN CODEWORDS OF TWO DISTINCT (N,K) REED-SOLOMON CODES OVER GF (2J)

[75] Inventor: Marvin Perlman, Granada Hills, Calif.

[73] Assignee: The United States of America as represented by the United States National Aeronautics and Space Administration, Washington, D.C.

[21] Appl. No.: 942,500

[22] Filed: Sep. 3, 1992

[51] Int. Cl.$^5$ .................. G06F 11/10; H03M 13/00
[52] U.S. Cl. ........................................ 371/37.1
[58] Field of Search .................. 371/37.1, 37.4, 38.1

[56] References Cited

U.S. PATENT DOCUMENTS

| | | | |
|---|---|---|---|
| 3,988,677 | 10/1976 | Fletcher et al. | 325/41 |
| 4,782,490 | 11/1988 | Tenengoltz | 371/40 |
| 4,843,607 | 6/1989 | Tong | 371/37 |
| 4,907,233 | 3/1990 | Deutsch et al. | 371/37.4 |

OTHER PUBLICATIONS

Solomon W. Golomb, "Theory of Transformation Groups of Polynomials over GF(2) with Applications to Linear Shift Register Sequences," American Elsevier Publishing Company, Inc., 1968, pp. 87–109.

Wesley Peterson, "Error–Correcting Codes," The M.I.T. Press and John Wiley & Sons, Inc., publishers, 1961, pp. 251–254.

M. Perlman and J. Lee, "Reed–Solomon Encoders— Conventional vs Berlekamp's Architecture," JPL Publication 82-71, Dec. 1, 1982.

E. R. Berlekamp, "Bit-Serial Reed–Solomon Encoders," IEEE Transactions on Information Theory, vol. IT 28, No. 6, pp. 869–874, Nov. 1982.

R. Miller and L. Deutsch, "Conceptual Design for a Universal Reed–Solomon Decoder," IEEE Transactions on Communications, vol. Com-29, No. 11, pp. 1721–1722, Nov. 1981.

"Telemetry Channel Coding," Recommendation for Space Data System Standards, CCSDS 101.0-B-2, Blue Book, Consultative Committee for Space Data Systems, Jan. 1987.

*Primary Examiner*—Robert W. Beausoliel, Jr.
*Assistant Examiner*—Joseph E. Palys
*Attorney, Agent, or Firm*—John H. Kusmiss; Thomas H. Jones; Guy M. Miller

[57] ABSTRACT

A process for realizing mappings between codewords of two distinct (N,K) Reed-Solomon codes over GF($2^J$) having selected two independent parameters: J, specifying the number of bits per symbol; and E, the symbol error correction capability of the code, wherein said independent parameters J and E yield the following: $N = 2^J - 1$, total number of symbols per codeword; $2E$, the number of symbols assigned a role of check symbols; and $K = N - 2E$, the number of code symbols representing information, all within a codeword of an (N,K) RS code over GF($2^J$), and having selected said parameters for encoding, the implementation of a decoder are governed by: $2^J$ field elements defined by a degree J primitive polynomial over GF(2) denoted by F(x); a code generator polynomial of degree 2E containing 2E consecutive roots of a primitive element defined by F(x); and, in a Berlekamp RS code, the basis in which the RS information and check symbols are represented.

The process includes separate transformation steps for symbol-by-symbol conversion for a first RS code to ultimately a second conventional RS code capable of being corrected by a conventional RS decoder, followed by a reverse sequence of the inverse of the first set of steps to arrive at codewords having corrected information symbols, at which time check symbols of the RS code may be discarded.

2 Claims, 6 Drawing Sheets

FROM FIG. 4a

---

PERMUTATION OF SYMBOLS OF WORD $R_{B.2}$ YIELDS $R_{B.3}$ $R_{[B.2]k} \rightarrow R_{[B.2]37k} = R_{[B.3]k}$ FOR $k=0,1,\ldots,254$ $F_{B.3}(X) = F_{B.2}(X) = F_{B.1}(X) = F_B(X)$ $g_{2.3}(x) = \prod_{j=1}^{32} (x-\alpha^{83j})$    PRIMITIVE ELEMENT CHANGE

---

SYMBOL-BY-SYMBOL CONVERSION OF $R_{B.3}$ TO $R_G$ $\alpha^i (R_{B.3} \text{ SYMBOL}) \rightarrow \beta^{212i} (R_G \text{ SYMBOL})$ $F_G(X) = X^8 + X^4 + X^3 + X^2 + 1$    WHERE $F_G(\beta) = 0$ $g_i(x) = \prod_{j=1}^{32} (x-\beta^j) = \sum_{i=0}^{32} G_i x^i$

---

DECODE $R_G \rightarrow C_G$

ERRONEOUS SYMBOLS IN $R_G$ ARE CORRECTED

FROM FIG. 4b

---

SYMBOL-BY-SYMBOL CONVERSION OF $C_G$ TO $C_{B.3}$

$\beta^i (C_G\ SYMBOL) \rightarrow \alpha^{83i} (C_{B.3}\ SYMBOL)$ $F_{B.3}(X) = F_B(X)$ $g_{2.3}(x) = \prod_{j=1}^{32} (x - \alpha^{83j})$

---

PERMUTATION OF SYMBOLS OF CODEWORD $C_{B.3}$ YIELD $C_{B.2}$

$C_{[B.3]k} \rightarrow C_{[B.3]193k} = C_{[B.2]k}\ \ FOR\ k=0,1,\ldots,254$ $F_{B.2}(X) = F_B(x)$ $g_{2.2}(x) = \prod_{j=1}^{32} (x - \alpha^{11j})$  PRIMITIVE ELEMENT CHANGE

---

SYMBOL-BY-SYMBOL CONVERSION DUE TO ROOT POWER TRANSLATION

CODEWORD $C_{B.2}$ TO CODEWORD $C_{B.1}$ $C_{B.1}(x) = C_{B.2}(\alpha^{54} x)$ $F_{B.1}(X) = F_B(x)$ $g_{2.1}(x) = \prod_{j=112}^{143} (x - \alpha^{11j})$  TRANSLATION OF POWERS OF ROOTS

FROM FIG. 4c

SYMBOL-BY-SYMBOL CONVERSION FROM $\{\alpha^i\}$ BASIS TO $\{\ell_j\}$ BASIS

YIELDS $C_B$ $F_B(X) = x^8 + x^7 + x^2 + x + 1$ WHERE $F_B(\alpha) = 0$ $$g_2(X) = \prod_{j=112}^{143}(X - \alpha^{11j}) = \sum_{i=0}^{32} G_i x^i$$

FIG. 4d

MAPPINGS BETWEEN CODEWORDS OF TWO DISTINCT (N,K) REED-SOLOMON CODES OVER GF (2J)

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

This invention relates to error-correcting codes, and more particularly to mappings between two distinct (N,K) Reed-Solomon (RS) codes over GF($2^J$).

BACKGROUND ART

An RS codeword is composed of N J-bit symbols of which K represents information and the remaining N-K symbols represent check symbols. Each check symbol is a linear combination of a distant subset of information symbols. RS codes have the following parameters:

| | |
|---|---|
| J | number of bits comprising each RS symbol |
| N = $2^J$ − 1 | number of symbols per RS codeword |
| E | symbol correction capability per RS codeword |
| 2E | number of checks symbols |
| K = N − 2E | number of symbols representing information |
| I | the depth of symbol interleaving |

Parameters J, E and I are independent. Each of the 2E check symbols (computed by an RS encoder) is a linear combination of a distinct subset of the K symbols representing information. Hence (N,K) RS codes are linear. Furthermore, every cyclic permutation of the symbols of an RS codeword results in a codeword.

The class of cyclic codes is a proper subset of the class of linear codes. Cyclic codes have a well defined mathematical structure. Encoders and decoders of cyclic codes are implementable by means of feedback shift registers (FSRs). However, RS codes are nonbinary and each stage must be capable of assuming each of the $2^J$ state-values corresponding to representations of J-bit symbols. Consequently, solid-state random-access memories (RAMs) are commonly used to serve as nonbinary FSR stages in RS encoders and decoders.

Every pair of distinct codewords belonging to a (N,K) RS code differs in at least 2E+1 corresponding symbols. The code thus has a minimum Hamming distance of 2E+1 and is E symbol error-correcting. A symbol is in error if one or more bits comprising the symbol are in error. A received word with any combination of E or fewer symbols in error will be correctly decoded. Whereas a received word containing more than E erroneous symbols will be incorrectly decoded with a probability of less than 1 chance in E factorial (i.e., 1/E!). Such a received word will be declared to be uncorrectable during the decoding process with probability 1-(1/E!).

Erroneous symbols (of a received word) confined to a region of E or fewer contiguous symbols in bit serial form are correctable. In terms of bits, every single burst-error (contained within a received word) of length J(E-1)+1 bits or less affects at most E symbols and thus is correctable.

A concatenated (NI,KI) RS code resulting from symbol interleaving to a depth of I is comprised of KI consecutive information symbols over which 2EI check symbols are computed and appended such that every $I^{th}$ symbol, starting with symbol 1,2, ... or I, belongs to the same (N,K) RS codeword. If a received word of a (NI,KI) code contains any single burst-error of length J(EI-1)+1 bits, the number of erroneous symbols belonging to the same N-symbol word will not exceed E. Upon symbol deinterleaving, each of the I, N-symbol words will be correctly decoded. Thus symbol interleaving to a depth of I increases the length (in bits) of correctable burst-errors by over I-fold.

It is the burst-error correction capability of RS codes that is exploited in concatenated coding where a convolution (probabilistic) code is the inner code and an RS (algebraic) code serves as the outer code. A large number of bit-errors within a burst results in a relatively few number of symbol errors. Convolutional codes outperform algebraic codes over a Gaussian channel. Burst-errors are encountered in a low signal-to-noise ratio environment. Also, in such an environment, a Viterbi decoder (of a convolutional code) can lose bit or symbol synchronization. This results in the generation of bursts by the Viterbi decoder. Until synchronization is re-established, burst-error protection is provided by the outer RS code. Expectation of burst-lengths among other factors (such as information rate K/N, a measure of efficiency, and transfer frame length in packet telemetry) influence the choice of magnitudes of parameters E and I. The effect of an infinite symbol interleaving depth can be achieved with a small value of I.

Mathematical Characterization of RS Symbols

A codeword of a (N,K) RS code is represented by a vector of N symbols (i.e., components)

$$C_{N-1}C_{N-2}\ldots C_{2E}C_{2E-1}\ldots C_0 \qquad (1)$$

where $C_i$ is taken from a finite field $2^J$ elements. The finite field is known as a Galois Field of order $2^J$ or simply GF($2^J$). Each element in GF($2^J$) is a distinct root of $$x^{2^J}-x=x(x^{2^J-1}-1)=0 \qquad (2)$$

The element O satisfies x=0 and each of the nonzero elements satisfies $$x^{2^J-1}-1=0 \qquad (3)$$

The nonzero roots of unity in Equation (3) form a "multiplicative group" which is cyclic and of order $N=2^J-1$. The "multiplicative" order of a root, $\alpha$, of Equation (3) is the least positive integer m for which $$\alpha^m=1 \text{ where } 2^J-1\equiv 0 \bmod m \qquad (4)$$

Note that $m|2^J-1$ where $u|v$ denotes u divides v. A root of maximum order (i.e., for which $m=2^J-1$) is termed "primitive" and is a "generator" of the cyclic multiplicative group in GF($2^J$).

An irreducible (i.e., unfactorable) polynomial over a finite field is analogous to a prime integer. A fundamental property of Galois fields is that every irreducible polynomial F(x) of degree r over GF(2) where $r|J$ (excluding x the only irreducible polynomial over GF(2) without a nonzero constant term) is a factor of $$x^{2^J-1}-1$$

Though F(x) is unfactorable over the binary field (i.e., GF(2)), it contains r distinct roots in GF($2^J$). GF($2^J$) is a finite field extension of GF(2), whereas GF(2) is a proper subfield of GF($2^J$). GF($2^s$) is a proper subfield of GF($2^J$) if and only if s|J and s<J.

EXAMPLE 1

Given the irreducible polynomial of degree r=J=4

$$F(x)=x^4+x^3+1 \text{ over } GF(2)$$

Let $\alpha$, among the 15 nonzero elements in GF($2^4$), denote a root of F(x). Then $$F(x)=\alpha^4+\alpha^3+1=0 \text{ and } \alpha^4=\alpha^3+1$$

where "+" denotes "sum modulo 2" (i.e., the Exclusive-OR operation). Repeated multiplicative operations on $\alpha$ gives $$\alpha, \alpha^2, \alpha^3, \alpha^4+\alpha^3+1, \alpha^5=\alpha^4+\alpha=\alpha^3+\alpha+1, \ldots \text{ and } \alpha^{15}=1=\alpha^0$$

Thus $\alpha$, a root of F(x), is primitive and F(x) is a primitive polynomial over GF(2). The elements of GF($2^4$) are expressible as powers of $\alpha$, each of which is equal to one of 16 distinct polynomials in $\alpha$ of degree less than 4 over GF(2) as follows:

$$\alpha^i=b_3\alpha^3+b_2\alpha^2+b_1\alpha+b_0 \text{ where } b_j \in GF(2)$$

The element O is the constant zero polynomial denoted by $$\alpha^*=0.\alpha^3+0.\alpha^2+0.\alpha+0$$

The elements of GF($2^4$) generated by $\alpha$ with $\alpha^*$ adjoined appear in Table I.

TABLE I

GF($2^4$) Generated by $\alpha$, a Root of F(x) = $x^4 + x^3 + 1$ over GF(2), with $\alpha^*$ Adjoined.

| i of $\alpha^i$ | $b_3$ | $b_2$ | $b_1$ | $b_0$ |
|---|---|---|---|---|
| * | 0 | 0 | 0 | 0 |
| 0 | 0 | 0 | 0 | 1 |
| 1 | 0 | 0 | 1 | 0 |
| 2 | 0 | 1 | 0 | 0 |
| 3 | 1 | 0 | 0 | 0 |
| 4 | 1 | 0 | 0 | 1 |
| 5 | 1 | 0 | 1 | 1 |
| 6 | 1 | 1 | 1 | 1 |
| 7 | 0 | 1 | 1 | 1 |
| 8 | 1 | 1 | 1 | 0 |
| 9 | 0 | 1 | 0 | 1 |
| 10 | 1 | 0 | 1 | 0 |
| 11 | 1 | 1 | 0 | 1 |
| 12 | 0 | 0 | 1 | 1 |
| 13 | 0 | 1 | 1 | 0 |
| 14 | 1 | 1 | 0 | 0 |

The binary operation of "addition" is termwise sum modulo 2 (or equivalently, vector addition over GF[2]).

$$\alpha^5+\alpha^{13}=[1011]+[0111]=[1101]=\alpha^{11}$$

The binary operation of "multiplication" is polynomial multiplication subject to the rules of modulo 2 arithmetic.

$$(b_3\alpha^3+b_2\alpha^2+b_1\alpha+b_0)(d_3\alpha^3+d_2\alpha^2+d_1\alpha+d_0),$$

with the result reduced modulo $\alpha^4+\alpha^3+1$. Since each element is expressible as a power of $\alpha$, "multiplication" is simplified with $$(\alpha^i)(\alpha^j)=\alpha^{i+j \bmod 15}$$

The logarithm to the base $\alpha$ for each field element appears in Table I. Thus $$(\alpha^{14})(\alpha^6)=\alpha^5=[1011]$$

Note that a more descriptive but less convenient representation of the O element is $\alpha^{-\infty}$.

$$\alpha^*\alpha^j=\alpha^* \text{ and } \alpha^*+\alpha^j=\alpha^j \text{ for all } j$$

Clearly commutativity holds for all field elements under both binary operations (a property of fields).

Consider the operation $\sigma$ which squares each of the roots of $$f(x) = \prod_{i=1}^{r} (x - \alpha_i)$$

any polynomial of degree r over GF(2). Solomon W. Golomb, "Theory of Transformation Groups of Polynomials over GF(2) with Applications to Linear Shift Register Sequences," American Elsevier Publishing Company, Inc., 1968, pp. 87-109. Since $$-1 \equiv 1 \bmod 2 \text{ and } (a + b)^2 = a^2 + b^2 \text{ over } GF \quad (2)$$

$$\sigma[f(x)] = \prod_{i=1}^{r} (x - \alpha_i^2) = \prod_{i=1}^{r} (t^2 - \alpha_i^2)$$

$$= \prod_{i=1}^{r} (t - \alpha_i)^2 = \left[\prod_{i=1}^{r} (t - \alpha_i)\right]^2$$

$$= [f(t)]^2 = f(t^2) = f(x)$$

The substitution $t^2=x$ is appropriately employed in proving that f(x) over GF(2) is invariant under the root-squaring operation $\sigma$. The operation $\sigma$ on f(x) which leaves f(x) unchanged is termed an automorphism. An operation on a root of f(x) is an automorphism if and only if it is an integer power of $\sigma$, the root-squaring operation. If, in particular, f(x) of degree r is irreducible over GF(2), then f(x) has the following r distinct automorphisms:

$$1, \sigma, \sigma^2, \ldots, \sigma^{r-1}$$

with respect to GF($2^r$). Consequently, f(x) has r distinct roots, namely, $$\alpha, \alpha^2, \alpha^{2^2}, \ldots, \alpha^{2^{r-1}}$$

Since $\sigma^r$ maps $\alpha$ into $\alpha^{2^r}$ and $\alpha^{2^r}=\alpha$ (from $\alpha^{2^r-1}=1$), $\sigma^r$ is the identity operation.

Consider the element $\beta$ among the $2^r-1$ nonzero elements in GF($2^r$). If $\beta$ has order m, then $\beta^j$ has order m/(m,j), where (m,j) denotes the Greatest Common Divisor (gcd) of m and j. Clearly, $m|(2^r-1)$ and $(m/(m,j))|(2^r-1)$. Recall that a primitive polynomial of degree r has $\alpha$, a primitive root of unity, as a root. Each of the r roots has order $2^r-1$ and is thus primitive since $(2^r-1, 2^i)=1$ for all i.

The set of integers $$\{i\} = \{1, 2, 2^2, \ldots, 2^{r-1}\}$$

taken from the multiplicative group of integers modulo $2^r-1$ form a subgroup. The corresponding set $$\{\alpha^i\} = \{\alpha, \alpha^2, \alpha^{2^2}, \ldots, \alpha^{2^{r-1}}\}$$

are the r roots of a primitive $r^{th}$ degree polynomial over GF(2). The "generalized cosets"

$$\{v, 2v, 2^2v, \ldots, (2^{r-1})v\}$$

are nonoverlapping sets which together with the subgroup $\{i\}$, the special coset where $v=1$, comprise the multiplicative group of integers modulo $2^r-1$. A one-to-one correspondence exists between the elements of the group and the $2^r-1$ roots of unity contained in $GF(2^r)$. If $(2^r-1, v)=1$, then $\{iv\}$ is a coset as defined in group theory. The elements of such a coset correspond to r $(2^r-1)^{st}$ primitive roots whose minimal polynomial is an $r^{th}$ degree primitive polynomial over GF(2). The polynomial of least degree that contains a given set of distinct roots (corresponding to a coset) is irreducible and termed a minimal polynomial.

The number of positive integers no greater than n (a positive integer) that are relatively prime to n is the number-theoretic function $\phi(n)$ known as Euler's phi function. Two integers n and i are termed relatively prime if $(n, i)=1$. Given $\alpha$, a primitive root of unity in $GF(2^r)$, then $\alpha^j$ is primitive if and only if $(2^r-1, j)=1$. There are a total of $\phi(2^r-1)$ primitive roots falling into $(\phi(2^r-1))/r$ groupings corresponding to cosets. The r roots in each grouping are roots of a distinct primitive polynomial and thus there are $(\phi(2^r-1))/r$ primitive polynomials of degree r over GF(2).

An "improper coset" results for values of v where $(2^r-1)\neq 1$. If the coset contains r distinct elements, the elements correspond to r $(2^r-1)^{st}$ nonprimitive roots of unity whose minimal polynomial is an irreducible nonprimitive $r^{th}$ degree polynomial over GF(2). Whereas the elements of a coset containing $s<r$ distinct elements (where s necessarily divides r) correspond to s $(2^s-1)^{st}$ roots of unity whose minimal polynomial is an irreducible polynomial of degree s over GF(2).

Complete factorization of $x^{24-1}$ for $r = J = 4$ appears in Table II.

TABLE II

Irreducible Factors of $x^{24-1} - 1$ for $r = J = 4$ over GF(2).

| Cosets | Roots | Polynomial | order of Roots |
|---|---|---|---|
| 0 | $\alpha^0$ | $x + 1$ | 1 |
| 1 2 4 8 | $\alpha, \alpha^2, \alpha^4, \alpha^8$ | $x^4 + x^3 + 1$ | 15 |
| 3 6 12 9 | $\alpha^3, \alpha^6, \alpha^{12}, \alpha^9$ | $x^4 + x^3 + x^2 + x + 1$ | 5 |
| 5 10 | $\alpha^5, \alpha^{10}$ | $x^2 + x + 1$ | 3 |
| 7 14 13 11 | $\alpha^7, \alpha^{14}, \alpha^{13}, \alpha^{11}$ | $x^4 + x + 1$ | 15 |

A degree 4 primitive polynomial is required to derive Tables I and II. Every irreducible polynomial over GF(2) of degree $r \leq 16$ can be determined from Tables in Appendix C of W. W. Peterson and Error-Correcting Codes, MIT Press, Cambridge, Mass., 1961. There are two primitive polynomials over GF(2) (which may be verified by the enumeration given by the number-theoretic function involving Euler's phi function). As shown in Table II, these are $$F_B(x) = x^4 + x^3 + 1 \text{ and } F_G(x) = x^4 + x + 1$$

The nonzero elements in Table I were generated by $\alpha$, a root of $F_B(x)$, and used in determining the irreducible polynomial factors in Table II. Irreducibility is a necessary but not sufficient condition for a polynomial over GF(2) to be primitive. Note that the roots of $F_G(x)$ are reciprocals of the respective roots of $F_B(x)$. That is $$\alpha^{-1} = \alpha^{15-1} = \alpha^{14},$$

$$\alpha^{-2} = \alpha^{13},$$

$$\alpha^{-4} = \alpha^{11}, \text{ and}$$

$$\alpha^{-8} = \alpha^{7},$$

and $F_B(x)$ and $F_G(x)$ are reciprocal polynomials over GF(2) where $$x^4 F_B(1/x) = F_G(x)$$

The reciprocal of a primitive polynomial is a primitive polynomial.

The (nonprimitive) irreducible polynomial with roots $\alpha^3$, $\alpha^6$, $\alpha^{12}$ and $\alpha^9$ is determined by using entries in Table I and appropriate field operations to expand $$(x-\alpha^3)(x-\alpha^6)(x-\alpha^{12})(x-\alpha^9)$$

or by determining the $b_i$'s $\in$ GF(2) which satisfy $$\alpha^{12} + b_3\alpha^9 + b_2\alpha^6 + b_1\alpha^3 + 1 = 0$$

The coefficients are linearly dependent vectors (i.e., polynomial coefficient strings). The latter method is easily programmable for computing the minimal polynomial (primitive or irreducible but nonprimitive) of degree r over GF(2) containing any given set of r distinct roots.

The elements $\alpha^*$, $\alpha^0$, $\alpha^5$ and $\alpha^{10}$ are roots of $$x^4 - x = x(x^3 - 1) = x(x+1)(x^2+x+1) \text{ over GF(2)}$$

and members of the subfield $GF(2^2) \subset GF(2^4)$. Whereas the elements $\alpha^*$ and $\alpha^0$ are roots of $$x^2 - x = x(x+1) \text{ over } GF(2)$$

and members of the subfield $GF(2) \subset GF(2^2) \subset GF(2^4)$.

In Table I, $GF(2^4)$ is defined by the primitive polynomial $$F_B(x) = x^4 + x^3 + 1 \quad (5)$$

The 15 nonzero elements can also be generated by $\beta$, a root of the primitive polynomial $$F_G(x) = x^4 + x + 1 \quad (6)$$

and by adjoining $\beta^*$ another field of order $2^4$ results. All finite fields of the same order, however, are isomorphic. Two fields with different representations are said to be isomorphic if there is a one-to-one onto mapping between the two which preserves the operations of addition and multiplication. The one-to-one mapping of the field elements defined by $F_B(x)$ in Equation (5) onto the field elements defined by $F_G(x)$ in Equation (6) appears in Table III below.

TABLE III

A One-to-One Mapping of Elements of GF($2^4$)
Defined by $F_B(x) = x^4 + x^3 + 1$ Onto Elements
of GF($2^4$) Defined by $F_G(x) = x^4 + x + 1$

| i of $a^i$ | $b_3$ | $b_2$ | $b_1$ | $b_0$ | 7i mod 15 of $\beta^{7i}$ | $c_3$ | $c_2$ | $c_1$ | $c_0$ |
|---|---|---|---|---|---|---|---|---|---|
| * | 0 | 0 | 0 | 0 | * | 0 | 0 | 0 | 0 |
| 0 | 0 | 0 | 0 | 1 | ⇌ 0 | 0 | 0 | 0 | 1 |
| 1 | 0 | 0 | 1 | 0 | → 7 | 1 | 0 | 1 | 1 |
| 2 | 0 | 1 | 0 | 0 | → 14 | 1 | 0 | 0 | 1 |
| 3 | 1 | 0 | 0 | 0 | → 6 | 1 | 1 | 0 | 0 |
| 4 | 1 | 0 | 0 | 1 | 13 | 1 | 1 | 0 | 1 |
| 5 | 1 | 0 | 1 | 1 | 5 | 0 | 1 | 1 | 0 |
| 6 | 1 | 1 | 1 | 1 | 12 | 1 | 1 | 1 | 1 |
| 7 | 0 | 1 | 1 | 1 | 4 | 0 | 0 | 1 | 1 |
| 8 | 1 | 1 | 1 | 0 | 11 | 1 | 1 | 1 | 0 |
| 9 | 0 | 1 | 0 | 1 | ← 3 | 1 | 0 | 0 | 0 |
| 10 | 1 | 0 | 1 | 0 | 10 | 0 | 1 | 1 | 1 |
| 11 | 1 | 1 | 0 | 1 | ← 2 | 0 | 1 | 0 | 0 |
| 12 | 0 | 0 | 1 | 1 | 9 | 1 | 0 | 1 | 0 |
| 13 | 0 | 1 | 1 | 0 | ← 1 | 0 | 0 | 1 | 0 |
| 14 | 1 | 1 | 0 | 0 | 8 | 0 | 1 | 0 | 1 |

The mappings $\alpha^i \to \beta^{7i}$ and $\beta^{7i} \to \alpha^i$ can be done by table look-up. They can also be realized by linear transformations. Consider the nonsingular matrix $$M_{\alpha\beta} = \begin{bmatrix} 1 & 1 & 0 & 0 \\ 1 & 0 & 0 & 1 \\ 1 & 0 & 1 & 1 \\ 0 & 0 & 0 & 1 \end{bmatrix}$$

Refer to Table III. Each row vector is defined by $F_G(x)$ (having $\beta$ as a root) and corresponds to a distinct unit vector defined by $F_B(x)$ (having $\alpha$ as a root). The four unit vectors are a natural basis for elements [$b_3\ b_2\ b_1\ b_0$], coefficient strings of polynomials in $\alpha$. Thus $$[b_3\ b_2\ b_1\ b_0] M_{\alpha\beta} = [c_3\ c_2\ c_1\ c_0]$$

is a linear transformation that maps $\alpha^i \to \beta^{7i}$. Similarly $$[c_3\ c_2\ c_1\ c_0] M_{\beta\alpha} = [b_3\ b_2\ b_1\ b_0]$$

where $$M_{\beta\alpha} = \begin{bmatrix} 0 & 1 & 0 & 1 \\ 1 & 1 & 0 & 1 \\ 0 & 1 & 1 & 0 \\ 0 & 0 & 0 & 1 \end{bmatrix}$$

is a linear transformation that maps $\beta^{7i} \to \alpha^i$. Clearly, $M_{\alpha\beta}^{-1} = M_{\beta\alpha}$.

The roots $\alpha$ and $\beta^7$ both have minimal polynomial $$x^4 + x^3 + 1$$

and $\alpha^i \rightleftarrows \beta^{7i}$ is one isomorphism between the two representations of GF($2^4$). Note that corresponding elements have the same multiplicative order. (Another isomorphism is $\alpha^{7i} \rightleftarrows \beta^i$ where $\alpha^7$ and $\beta$ both have minimal polynomial $x^4+x+1$). Example 2 illustrates preservation of field operations.

EXAMPLE 2

Refer to entries in Table II.

$$\begin{array}{rcccccccc}
& 1\ 0\ 0\ 1 & = & \alpha^4 & \rightleftarrows & \beta^{13} & = & 1\ 1\ 0\ 1 \\
+ & 0\ 1\ 0\ 1 & = & \alpha^9 & \rightleftarrows & \beta^3 & = & 1\ 0\ 0\ 0 \\
\hline
= & 1\ 1\ 0\ 0 & = & \alpha^{14} & \rightleftarrows & \beta^8 & = & 0\ 1\ 0\ 1
\end{array}$$

and $$\begin{array}{rcccccccc}
& \alpha^{10} & = & 1\ 0\ 1\ 0 & \rightleftarrows & 0\ 1\ 1\ 1 & = & \beta^{10} \\
\times & \alpha^8 & = & 1\ 1\ 1\ 0 & \rightleftarrows & 1\ 1\ 1\ 0 & = & \beta^{11} \\
\hline
= & \alpha^3 & = & 1\ 0\ 0\ 0 & \rightleftarrows & 1\ 1\ 0\ 0 & = & \beta^6
\end{array}$$

Berlekemp's Representation of RS Symbols Using the Concept of a Trace

Consider the field elements $$\alpha^i = b_3\alpha^3 + b_2\alpha^2 + b_1\alpha + b_0 \text{ for } i = *, 0, \ldots, 14 \quad (7)$$

in GF($2^4$) defined by $F_B(x)$ in Equation (5). See Tables II and III. The trace of element $\alpha$ is defined as $$Tr(\alpha) = \alpha + \alpha^2 + \alpha^4 + \alpha^8 = 0\ 0\ 0\ 1 = 1$$

Similarly
$$Tr(\alpha^3) = \alpha^3 + \alpha^6 + \alpha^{12} + \alpha^9 = 0\ 0\ 0\ 1 = 1$$
$$Tr(\alpha^5) = \alpha^5 + \alpha^{10} + \alpha^{20} + \alpha^{40}$$
$$= \alpha^5 + \alpha^{10} + \alpha^5 + \alpha^{10} = 0\ 0\ 0\ 0 = 0$$
$$Tr(\alpha^7) = \alpha^7 + \alpha^{14} + \alpha^{13} + \alpha^{11} = 0\ 0\ 0\ 0 = 0$$

and
$$Tr(\alpha^*) = Tr(0) = 0 + 0 + 0 + 0 = 0$$
$$Tr(\alpha^0) = Tr(1) = 1 + 1 + 1 + 1 = 0$$

The trace of roots of unity corresponding to members of the same coset in Table II are identical. For example, $$\begin{aligned} Tr(\alpha^{14}) &= \alpha^{14} + \alpha^{13} + \alpha^{11} + \alpha^7 \\ &= Tr(\alpha^7) = Tr(\alpha^{13}) = Tr(\alpha^{11}) = 0 \end{aligned}$$

In general the trace Tr is a function on GF($p^r$) over GF(p) where p is a prime. Of particular interest is GF($2^r$) over GF(2) where Tr is defined by $$Tr(\gamma) = \sum_{i=0}^{r-1} \gamma^{2^i} \text{ where } \gamma \in GF(2^r)$$

The trace has the following properties:
(1) $Tr(\gamma) \in GF(2)$
(2) $Tr(\gamma+\delta) = Tr(\gamma) + Tr(\delta)$
(3) $Tr(c\gamma) = cTr(\gamma)$ where $c \in GF(2)$
(4) $Tr(1) = r \mod 2$
Property (1) follows from $$[Tr(\gamma)]^2 = (\gamma + \gamma^2 + \gamma^{2^2} + \ldots + \gamma^{2^{r-1}})^2$$
$$= \gamma^2 + \gamma^{2^2} + \gamma^{2^3} + \ldots + \gamma^{2^r}$$
$$= Tr(\gamma) \text{ since } \gamma^{2^r} = \gamma$$

which implies that $Tr(\gamma) \in GF(2)$. Proofs of properties (1), (2) and (3) for traces of elements in $GF(p^r)$ appear in M. Perlman and J. Lee, Reed-Solomon Encoders Conventional vs Berlekamp's Architecture," JPL Publication 82-71, Dec. 1, 1982. Property (4) follows directly from the definition of a trace. From properties (2) and (3), the trace of $\alpha^i$ is a linear combination of a fixed set of coefficients of powers of $\alpha$ as shown in the following example:

EXAMPLE 3

From equation (7) where $\alpha^i$'s defined by $F_B(x)=x^4+x^3+1$ appear in Table III and in this example $$Tr(\alpha^i) = Tr(b_3\alpha^3 + b_2\alpha^2 + b_1\alpha + b_0)$$
$$= b_3 Tr(\alpha^3) + b_2 Tr(\alpha^2) + b_1 Tr(\alpha) + b_0 Tr(\alpha^0)$$

Since (as previously shown)

$$Tr(\alpha^3)=Tr(\alpha^2)=Tr(\alpha)=1$$

and $Tr(\alpha^0)=Tr(1)=0$ $$Tr(\alpha^i)=b_3+b_2+b_1$$

The trace of each of the 16 elements are tabulated as follows:

| i of $\alpha^i$ | $b^3$ | $b^2$ | $b^1$ | $b^0$ | $Tr(\alpha^i)$ |
|---|---|---|---|---|---|
| * | 0 | 0 | 0 | 0 | 0 |
| 0 | 0 | 0 | 0 | 1 | 0 |
| 1 | 0 | 0 | 1 | 0 | 1 |
| 2 | 0 | 1 | 0 | 0 | 1 |
| 3 | 1 | 0 | 0 | 0 | 1 |
| 4 | 1 | 0 | 0 | 1 | 1 |
| 5 | 1 | 0 | 1 | 1 | 0 |
| 6 | 1 | 1 | 1 | 1 | 1 |
| 7 | 0 | 1 | 1 | 1 | 0 |
| 8 | 1 | 1 | 1 | 0 | 1 |
| 9 | 0 | 1 | 0 | 1 | 1 |
| 10 | 1 | 0 | 1 | 0 | 0 |
| 11 | 1 | 1 | 0 | 1 | 0 |
| 12 | 0 | 0 | 1 | 1 | 1 |
| 13 | 0 | 1 | 1 | 0 | 0 |
| 14 | 1 | 1 | 0 | 0 | 0 |

The elements $b_3 b_2 b_1 b_0$ (representing $\alpha^i$'s in equation (7)) of $GF(2^4)$ in Example 3 form a 4-dimensional vector space. Any set of linearly independent vectors which spans the vector space is a basis. The natural basis (previously discussed in connection with Table III.) is comprised of unit vectors $\alpha^3$ [1 0 0 0], $\alpha^2$ [0 1 0 0], $\alpha$[0 0 1 0] and 1 [0 0 0 1].

Berlekamp's Dual Basis

Berlekamp, motivated to significantly reduce the hardware complexity of spaceborne RS encoders [Perlman, et al., supra, and E. R. Berlekamp, "Bit-Serial Reed-Solomon Encoders," *IEEE Transactions on Information Theory*, Vol. IT 28, No. 6, pp. 869–874, November 1982] introduced parameter $\lambda$ which results in another representation of RS symbols. The parameter $\lambda$ is a field element where $$1, \lambda, \lambda^2, \ldots, \lambda^{r-1}$$

is a basis in $GF(2^r)$. Any field element that is not a member of subfield will form such a basis. If $\lambda=\alpha$, a generator of the field, a natural basis results. Berlekamp's choice of $\lambda$ and other independent parameters, such as the primitive polynomial known as the field generator polynomial, governing the representation of 8-bit RS symbols of a (255, 223) RS code was based solely on encoder hardware considerations detailed in Perlman, et al., supra. For a given basis $$\{1, \lambda, \lambda^2, \ldots, \lambda^{r-1}\}=\{\lambda^k\}$$

in $GF(2^r)$, its dual basis $\{l_j\}$, also called a complementary or a trace-orthogonal basis, is determined. Each RS symbol corresponds to a unique representation in the dual basis $$\{l_0, l_1, \ldots, l_{r-1}\}=\{l_j\}$$

EXAMPLE 4

Consider the 16 field elements in Example 3. Members of subfields $GF(2)$ and $GF(2^2)$ are $$\alpha^*, \alpha^0 \text{ and } \alpha^*, \alpha^0, \alpha^5, \alpha^{10}$$

respectively. Let $\lambda=\alpha^6$ (one of 12 elements that is not a member of a subfield). Then $$\{1, \lambda, \lambda^2, \alpha^3\}=\{1, \alpha^6, \alpha^{12}, \alpha^9\}$$

is a basis in $GF(2^4)$. Each field element has the following correspondence $$\alpha^i \rightleftharpoons v_0 l_0 + v_1 l_1 + v_2 l_2 + v_3 l_3$$

where $$v_k = Tr(\lambda^k \alpha^i) = Tr(\alpha^{6k+i})$$

The entries in column $v_0$ (coefficients of $l_0$) of Table IV below are $$v_0 = Tr(\alpha^i)$$

as determined in Example 3. Whereas entries in column $v_1$ (coefficients of $l_1$) are $$v_1 = Tr(\alpha^{6+i})$$

which is column $v_0$ (excluding $Tr(\alpha^*)$) cyclically shifted upwards six places. The remaining columns are similarly formed.

TABLE IV

| | Elements in $GF(2^4)$ Represented in Basis $\{l_0, l_1, l_2, l_3\}$ | | | | | | | | |
|---|---|---|---|---|---|---|---|---|---|
| i of $\alpha^i$ | $b_3$ | $b_2$ | $b_1$ | $b_0$ | $Tr(\alpha^i)$ | $v_0$ | $v_1$ | $v_2$ | $v_3$ |
| * | 0 | 0 | 0 | 0 | 0 | 0 | 0 | 0 | 0 |
| 0 | 0 | 0 | 0 | 1 | 0 | 0 | 1 | 1 | 1 |
| 1 | 0 | 0 | 1 | 0 | 1 | 1 | 0 | 0 | 1 |
| 2 | 0 | 1 | 0 | 0 | 1 | 1 | 1 | 0 | 0 |
| 3 | 1 | 0 | 0 | 0 | 1 | 1 | 1 | 0 | 0 |
| 4 | 1 | 0 | 0 | 1 | 1 | 1 | 0 | 1 | 0 |
| 5 | 1 | 0 | 1 | 1 | 0 | 0 | 0 | 1 | 1 |
| 6 | 1 | 1 | 1 | 1 | 1 | 1 | 1 | 1 | 1 |

TABLE IV-continued

Elements in GF($2^4$) Represented in Basis $\{l_0, l_1, l_2, l_3\}$

| i of $a^i$ | $b_3$ | $b_2$ | $b_1$ | $b_0$ | Tr($\alpha^i$) | $v_0$ | $v_1$ | $v_2$ | $v_3$ | |
|---|---|---|---|---|---|---|---|---|---|---|
| 7  | 0 | 1 | 1 | 1 | 0 | 0 | 0 | 1 | 0 | $l_2$ |
| 8  | 1 | 1 | 1 | 0 | 1 | 1 | 0 | 0 | 0 | $l_0$ |
| 9  | 0 | 1 | 0 | 1 | 1 | 1 | 0 | 1 | 1 |     |
| 10 | 1 | 0 | 1 | 0 | 0 | 0 | 1 | 0 | 0 | $l_1$ |
| 11 | 1 | 1 | 0 | 1 | 0 | 0 | 1 | 1 | 0 |     |
| 12 | 0 | 0 | 1 | 1 | 1 | 1 | 1 | 1 | 0 |     |
| 13 | 0 | 1 | 1 | 0 | 0 | 0 | 1 | 0 | 1 |     |
| 14 | 1 | 1 | 0 | 0 | 0 | 0 | 0 | 0 | 1 | $l_3$ |

The dual basis of $$\{\lambda^k\} = \{1, \lambda, \lambda^2, \lambda^3\} \text{ where } \lambda = \alpha^6 \quad (8)$$

as determined in Table IV is $$\{l_j\} = \{l_0, l_1, l_2, l_3\} = \{\alpha^8, \alpha^{10}, \alpha^7, \alpha^{14}\} \quad (9)$$

The elements $\lambda^k l_j \in$ GF($2^4$) and Tr($\lambda^k l_j$) $\in$ GF(2) appear, respectively, in the following "multiplication" tables where $\lambda^k$ and $l_j$ are arguments.

|  | $l_0$ | $l_1$ | $l_2$ | $l_3$ |
|---|---|---|---|---|
| 1 | $\alpha^8$ | $\alpha^{10}$ | $\alpha^7$ | $\alpha^{14}$ |
| $\lambda$ | $\alpha^{14}$ | $\alpha$ | $\alpha^{13}$ | $\alpha^5$ |
| $\lambda^2$ | $\alpha^5$ | $\alpha^7$ | $\alpha^4$ | $\alpha^{11}$ |
| $\lambda^3$ | $\alpha^{11}$ | $\alpha^{13}$ | $\alpha^{10}$ | $\alpha^2$ |

$\lambda^k l_j$

|  | $l_0$ | $l_1$ | $l_2$ | $l_3$ |
|---|---|---|---|---|
| 1 | 1 | 0 | 0 | 0 |
| $\lambda$ | 0 | 1 | 0 | 0 |
| $\lambda^2$ | 0 | 0 | 1 | 0 |
| $\lambda^3$ | 0 | 0 | 0 | 1 |

Tr($\lambda^k l_j$)

For the basis $\lambda^k$ in (8) and its dual $\{l_j\}$ in Equation (9)

$$Tr(\lambda^k l_j) = \begin{cases} 1 \text{ for } j = k \text{ and } 0 \leq k < 4 \\ 0 \text{ for } j \neq k \text{ and } 0 \leq k < 4 \end{cases} \quad (10)$$

as shown in the foregoing multiplication tables. Given any element $\alpha^i$ in GF($2^4$). Its components in $\{l_j\}$ are readily computed as follows:

$$\alpha^i = \sum_{j=0}^{3} v_j l_j \text{ and } \lambda^k \alpha^i = \sum_{j=0}^{3} v_j \lambda^k l_j \quad (11)$$

and $$Tr(\lambda^k \alpha^i) = \sum_{j=0}^{3} v_j Tr(\lambda^k l_j) = v_k$$

from property (3) of a trace and Equation (10).

Every basis in GF($2^r$) has a dual basis. Furthermore, a one-to-one correspondence $$\alpha^i \rightleftharpoons \sum_{j=0}^{r-1} v_j l_j$$

exists from which Equation (11) follows with the appropriate change in the range of indices in Equations (10) and (11). The trace is used in modeling bit-serial multiplication in hardware of a fixed element expressed as a power of $\alpha$ (an RS symbol representing a coefficient of a generator polynomial g(x), subsequently discussed) and any RS symbol expressed in basis $\{l_j\}$. The resulting product is represented in basis $\{l_j\}$.

It is important to note that the one-to-one mapping(s) in Table IV of Example 4

$$v_0 l_0 + v_1 l_1 + v_2 l_2 + v_3 l_3 \rightarrow \alpha^i \text{ and } \alpha^i$$
$$\rightarrow v_0 l_0 + v_1 l_1 + v_2 l_2 + v_3 l_3$$

can be achieved by either table look-up or by the following respective linear transformations:

$$[v_0 \, v_1 \, v_2 \, v_3] T_{l\alpha} = [b_3 \, b_2 \, b_1 \, b_0]$$

and $$[b_3 \, b_2 \, b_1 \, b_0] T_{\alpha l} = [v_0 \, v_1 \, v_2 \, v_3]$$

where $$T_{l\alpha} = \begin{bmatrix} 1 & 1 & 1 & 0 \\ 1 & 0 & 1 & 0 \\ 0 & 1 & 1 & 1 \\ 1 & 1 & 0 & 0 \end{bmatrix} \quad T_{\alpha l} = \begin{bmatrix} 1 & 1 & 0 & 1 \\ 1 & 1 & 0 & 0 \\ 1 & 0 & 0 & 1 \\ 0 & 1 & 1 & 1 \end{bmatrix}$$

and $$T_{l\alpha}^{-1} = T_{\alpha l}$$

The one-to-one onto mapping is an isomorphism where the operation of "addition" is preserved. Note that "multiplication" in basis $\{l_j\}$ has not been defined.

In the section above on Mathematical Characterization of RS Symbols, the two primitive polynomials over GF($2^4$)

$$F_B(x) = x^4 + x^3 + 1 \text{ and } F_G(x) = x^4 + x + 1$$

were discussed in connection with establishing representations for RS symbols. In RS coding terminology these are referred to as field generator polynomials. The subscript B in $F_B(x)$ denotes the field generator polynomial with RS-symbol representation associated with Berlekamp encoder architecture. The subscript G in $F_G(x)$ denotes the field generator polynomial with RS-symbol representation taken from GF($2^4$) defined by $F_G(x)$. The associated encoder architecture is of the pre-Berlekamp or "conventional" type.

The Generator Polynomial and Structure of a Reed-Solomon Code with Conventional Type Architecture The $2^J - 1$ (J-bit) symbols of the (N,K) RS codeword in (1) are GF($2^J$) coefficients of the codeword polynomial $$c(x) = c_{N-1} x^{N-1} + c_{N-2} x^{N-2} + \ldots$$
$$+ c_{2E} x^{2E} + c_{2E-1} x^{2E-1} + \ldots + c_0 \quad (12)$$

RS codes are cyclic and are completely characterized by a generator polynomial $$g(x) = \prod_{j=1}^{2E} (x - \beta^j) = \sum_{i=0}^{2E} g_i x^i \quad (13)$$

Recall the cyclic property of RS codes introduced in the first section on RS code parameters and properties where every cyclic permutation of the symbols of a codeword results in a codeword. Also codewords of cyclic codes (a subset of linear codes) are mathematically described as codeword polynomials where every codeword polynomial C(x) expressed in Equation (12)) over $GF(2^J)$ contains g(x) in Equation (13) as a factor. The generator polynomial (of an E symbol error-correcting RS code) g(x) of degree 2E, equal to number of symbols serving as check symbols, contains 2E consecutive nonzero powers of a primitive element $\beta$ in $GF(2^J)$ as roots. There is no restriction on which primitive element among $\phi(2^J-1)$ is chosen. Furthermore, though it has been well known that the 2E consecutive powers of a primitive element $\beta^s$ could be $$(\beta^s), (\beta^s)^2, \ldots, (\beta^s)^{2E}$$

where (s, $2^J-1$)=1. The value s=1 has invariably been used in practical applications. Berlekamp was the first to exploit the use of s>1 and more importantly 2E roots with a range of powers of j from b to b+2E-1 in $(\beta^s)^j$ in simplifying encoder hardware.

RS codes are a class of maximum distance separable (MDS) codes where the minimum Hamming distance $$D_{min} = N - K + 1 = 2E + 1$$

is the maximum possible for a linear code over any field. "Separable" (in MDS) and "systematic" are synonymous terms for codes whose information symbols occupy leading adjacent positions and are followed by check symbols.

The Hamming weight of an RS codeword is the number nonzero symbols. The Hamming weight distribution of MDS (hence RS) codes is completely deterministic. Error probabilities can be computed from the Hamming weight distribution.

Encoding is the process of computing 2E check symbols over distinct subsets of K information symbols such that the N=K+2E symbols are coefficients of C(x) in (12) and g(x) is a factor of C(x).

Given the information polynomial $$I(x) = C_{n-1}x^{K-1} + C_{n-2}x^{k-2} + \ldots + C_{2E} \quad (14)$$

check symbols are computed as follows:

$$x^{2E}I(x) = C_{N-1}x^{N-1} + C_{N-2}x^{N-2} + \ldots + \quad (15)$$
$$C_{2E}x^{2E} + 0x^{2E-1} + 0x^{2E-2} + \ldots + 0x^0$$

and $$\frac{x^{2E}I(x)}{g(x)} = H(x) + \frac{r(x)}{g(x)}$$

$$x^{2E}I(x) = g(x)H(x) + r(x)$$

where $$r(x) = C_{2E-1}x^{2E-1} + C_{2E-2}x^{2E-2} + \ldots + c_0 \quad (16)$$

From Equation (15)

$$x^{2E}I(x) \equiv r(x) \bmod g(x) \quad C(x) = x^{2E}I(x) + r(x) \equiv 0 \bmod g(x) \quad (17)$$

The polynomials $x^{2E}I(x)$ and r(x) in Equation (16) are nonoverlapping and when "added" (where $-r(x) \equiv r(x)$) yield C(x) in (12). The generator polynomial g(x) is a factor of every (N,K) RS codeword polynomial C(x) as shown in (17).

A functional logic diagram of a conventional (N,K) RS encoder is given in FIG. 1. Assume the register (a cascade of 2E J-bit storage elements 1 through n of a RAM) of the FSR is initially cleared. With switches SW A and SW B in the up position, J-bit information symbols representing coefficients of I(x) are serially entered. An RS symbol is one argument for each of the multipliers $M_0, M_1, \ldots M_{2E-1}$, and the other argument is $G_0, G_1, \ldots G_{2E-1}$, respectively, where $G_i$ is the coefficient of $x^i$ of the codes generator polynomial. Symbol $C_{N-1}$ is entered first. After the entry of $C_{2E}$, the last information symbol, the check symbols (which represent coefficients of r(x)), reside in the register where $C_i$ is stored in the register stage labeled $x^i$. At this time, switches SW A and SW B are placed in the down position. The output of each multiplier is a bit-serial input to the respective modulo-two adders $A_1$ through $A_{2E-1}$. Adder $A_{in}$ is in the circuit only during the information input mode for reducing the input symbol, and the output of stage, $x^{2E-1}$, are bit serially added during the information mode. See Equations (14) through (17).

The check symbols starting with $C_{2E-1}$ are then delivered to the channel (appended to the information symbols) while the register is cleared in preparation for the next sequence of K information symbols. Multiplication of I(x) by $x^{2E}$ is achieved by inputting the information symbols into the feedback path of the FSR in FIG. 1. The FSR divides $x^{2E}I(x)$ by g(x) and reduces the result modulo g(x). The fixed multipliers $$G_{2E-1}, G_{2E-2}, \ldots, G_1, G_0 \in GF(2^J) \quad (18)$$

in the respective interstage feedback paths of the FSR are coefficients of g(x) in Equation (13) (excluding $G_{2E}=1$). Note that $$g(x) = x^{2E} + G_{2E-1}x^{2E-1} + G_{2E-2}x^{2E-2} + \ldots + G_1x + G_0$$

(and each scalar multiple of g(x)) is an RS codeword polynomial of lowest degree. A K information (J-bit) symbol sequence of K-1 0's (00 ... 0) followed by the nonzero information symbol 1 (00 ... 01) when encoded yields $$C(x) = 0x^{N-1} + 0x^{N-2} + \ldots$$
$$+ 0x^{2E+1} + x^{2E} + G_{2E-1}x^{2E-1} + \ldots$$
$$+ G_1x + G_0 = x^{2E} + G_{2E-1}x^{2E-1} + \ldots$$
$$+ G_1x + G_0$$

since $$x^{2E} \equiv G_{2E-1}x^{2E-1} + \ldots + G_1x + G_0 \bmod g(x)$$

For each distinct multiplier in Equation (18), a ROM is addressed by the binary representation of a symbol appearing on the feedback path. Stored at the addressed location is the log (in binary) of the product of the symbol and the fixed multiplier reduced modulo $2^J-1$. An antilog table stored in a ROM (which may be part of the same ROM storing logs) is subsequently accessed to deliver the binary form of the product.

EXAMPLE 5

Given $J=4$ and $E=3$, the parameters of a (15,9) RS code employing "conventional" encoder architecture shown in FIG. 1. The $\log_\beta$ and binary representations of the RS symbols (i.e., field elements in $GF(2^4)$) defined by the field generator polynomial $$F_G(x) = x^4 + x + 1$$

appear in the following table:

| i of $\beta^i$ | $c_3$ | $c_2$ | $c_1$ | $c_0$ |
|---|---|---|---|---|
| * | 0 | 0 | 0 | 0 |
| 0 | 0 | 0 | 0 | 1 |
| 1 | 0 | 0 | 1 | 0 |
| 2 | 0 | 1 | 0 | 0 |
| 3 | 1 | 0 | 0 | 0 |
| 4 | 0 | 0 | 1 | 1 |
| 5 | 0 | 1 | 1 | 0 |
| 6 | 1 | 1 | 0 | 0 |
| 7 | 1 | 0 | 1 | 1 |
| 8 | 0 | 1 | 0 | 1 |
| 9 | 1 | 0 | 1 | 0 |
| 10 | 0 | 1 | 1 | 1 |
| 11 | 1 | 1 | 1 | 0 |
| 12 | 1 | 1 | 1 | 1 |
| 13 | 1 | 1 | 0 | 1 |
| 14 | 1 | 0 | 0 | 1 |

Let the degree 6 (i.e., 2E) generator polynomial be $$g_1(x) = \prod_{j=1}^{6} (x - \beta^j) \qquad (19)$$

$$= x^6 + \beta^{10}x^5 + \beta^{14}x^4 + \beta^4 x^3 + \beta^6 x^2 + \beta^9 x + \beta^6$$

From (19), the fixed multipliers in the respective feedback paths of FIG. 1 (where $G_{2E-1} = G_5$) are $$\{G_5, G_4, G_3, G_2, G_1, G_0\} = \{\beta^{10}, \beta^{14}, \beta^4, \beta^6, \beta^9, \beta^6\}$$

Since there are five distinct multipliers, five sets of ROM's are needed for "multiplication".

In Example 5, the field generator polynomial $F_G(x)$ and the code generator polynomial $g_1(x)$ in Equation (19) completely characterize a (15,9) RS code which is 3 symbol error-correcting where $D_{min} = 2E+1 = 7$. The 16 4-bit symbols appear in the table in Example 5 with their corresponding $\log_\beta$ representations (i.e., i of $\beta^i$).

EXAMPLE 6

Consider the following (15,9) RS codewords with symbols expressed in $\log_\beta$ form (i.e., i of $\beta^i$) as given in the table in Example 5. The code's generator polynomial is $g_1(x)$ in Equation (19).

| Codeword | $C_{14}$ | $C_{13}$ | $C_{12}$ | $C_{11}$ | $C_{10}$ | $C_9$ | $C_8$ | $C_7$ | $C_6$ | $C_5$ | $C_4$ | $C_3$ | $C_2$ | $C_1$ | $C_0$ |
|---|---|---|---|---|---|---|---|---|---|---|---|---|---|---|---|
| $C^0$ | * | * | * | * | * | * | * | * | * | * | * | * | * | * | * |
| $C^1$ | * | * | * | * | * | * | * | * | 0 | 10 | 14 | 4 | 6 | 9 | 6 |
| $C^2$ | * | * | * | * | * | * | * | 0 | 10 | 14 | 4 | 6 | 9 | 6 | * | * |
| $C^3$ | * | * | * | * | * | * | 0 | 10 | 3 | 2 | 8 | 14 | * | 9 | 6 |
| $C^4$ | 10 | 10 | 10 | 10 | 10 | 10 | 10 | 10 | 10 | 10 | 10 | 10 | 10 | 10 | 10 |

$C^1(x) = g_1(x)$, a codeword polynomial of least degree. $C^0(x)$ is the codeword polynomial whose coefficient string $C^0$ is * * ... * (where $\beta^* = 0000$). Since RS codes are linear or group codes, $C^0$ (of an appropriate length) is a codeword of every (N,K) RS code over $GF(p^r)$. Furthermore, every sequence of N identical symbols such as $C^4$ is an RS codeword. Codeword $C^2$ is a cyclic permutation (two places to the left) of $C^1$. Thus $$c^2(x) = x^2 c^1(x) = x^2 g_1(x)$$

(where powers of x are necessarily reduced modulo 15). Codeword $C^3$ is a linear combination of $C^1$ and $C^2$ and $$c^3(x) = (x^2 + 1) g_1(x).$$

Clearly $$g_1(x) | C^0(x)$$

and dividing $C^4(x)$ by $g_1(x)$ leads to the Euclidean form $$c^4(x) = (\beta^{10}x^8 + x^7 + \beta^9 x^6 + \beta^2 x^5 + \beta^6 x^4 + \beta^8 x^3 + \beta^6 x^2 + \beta^3 x + \beta^4) g_1(x)$$

The Hamming distance between distinct pairs of codewords are listed in the following table.

| Codewords | Hamming Distance |
|---|---|
| $C^0, C^1$ | 7 |
| $C^0, C^2$ | 7 |
| $C^0, C^3$ | 8 |
| $C^0, C^3$ | 15 |
| $C^1, C^2$ | 8 |
| $C^1, C^3$ | 7 |
| $C^1, C^4$ | 14 |
| $C^2, C^3$ | 7 |
| $C^2, C^4$ | 14 |
| $C^3, C^4$ | 14 |

Refer to FIG. 1 and the (15,9) RS code discussed in Examples 5 and 6. The six register stages $x^5$, $x^4$, $x^3$, $x^2$, $x$, 1 are initially cleared. Successive states of the six stages when encoding the following sequence of information symbols

| $\{C_{14}, C_{13}, \ldots, C_9, C_8, C_7, C_6\} = \{*, *, \ldots, *, 0, 10, 3\}$ are | | | | | | |
|---|---|---|---|---|---|---|
| j of $c_j$ | Symbol | $x^5$ | $x^4$ | $x^3$ | $x^2$ | $x$ | 1 |
| 14 | * | * | * | * | * | * | * |
| 13 | * | * | * | * | * | * | * |
| . | . | . | . | . | . | . | . |
| 9 | * | * | * | * | * | * | * |
| 8 | 0 | 10 | 14 | 4 | 6 | 9 | 6 |
| 7 | 10 | 14 | 4 | 6 | 9 | 6 | * |
| 6 | 3 | 2 | 8 | 14 | * | 9 | 6 |
| | | ↑ | | | | | |
| | | $c_5$ | | | | | |

The states of the register stages in a given row reflects the entry of the corresponding information symbol. When entering an information symbol, it is "added" by Adder $A^{in}$ to the content of stage $x^5$ (i.e., $x^{2E-1}$) as it is shifting out (to the left in FIG. 1) and the resulting symbol is simultaneously "multiplied" by each feedback coefficient. This string of symbols is (vector) "added" to the (left) shifted contents of the register. It is this result that corresponds to the states of the register after entering an information symbol. The following events occur when entering the last information symbol $C_6$ in deriving $C^3$ given on page 28.

1) left shift $\beta^{14}$ $\beta^4\ \beta^6\ \beta^9\ \beta^6\ \beta^*\ \beta^*$
   incoming symbol $C_6\ \beta^3$
2) add $\beta^0$
3) multiply $\beta^0[\beta^{10}\ \beta^{14}\ \beta^4\ \beta^6\ \beta^9\ \beta^6] = \beta^{10}\ \beta^{14}\ \beta^4\ \beta^6\ \beta^9\ \beta^6$
4) add $\underline{\beta^2\ \beta^8\ \beta^{14}\ \beta^*\ \beta^9\ \beta^6}$ As shown in FIG. 1 "addition" of symbols is done bit-serially during shifting. Whereas each of the five different "multiplications" requires a log and antilog table stored in a ROM as previously discussed. The remainder upon dividing $x^6(x^8+\beta^{10}x^7+\beta^3x^6)$ by $g_1(x)$ in (19) verifies the (hardware) encoding result.

```
                    0 * 0
0 10 14 4 6 9 6 | 0 10 3  *  *  *  *  *
                  0 10 14 4  6  9  6
                     0  4  6  9  6  *  *
                     0 10 14  4  6  9  6
Check symbols -->    2  8 14  *  9  6
```

The quotient $$0*0 \rightleftharpoons x^2+1 \text{ and } g_1(x)$$

are factors of $C^3(x)$.

The Generator Polynomial and Structure of a Reed-Solomon Code with Berlekamp Architecture The generator polynomial g(x) used in Berlekamp (N,K) RS encoder architecture is a self-reciprocal polynomial of degree 2E over $GF(2^J)$. As in the design of conventional (N,K) RS encoder architecture $GF(2^J)$ is defined by a field generator polynomial of degree J over GF(2). The generator polynomial $$g(x) = \prod_{j=b}^{b+2E-1}(x-\gamma^j) = \sum_{i=0}^{2E} G_i x^i \tag{20}$$

where $\alpha$ and $\gamma = \alpha^s$ are primitive elements in $GF(2^J)$. (A positive integer value of s is chosen whereby (s, $2^J-1$)=1)). In contrast with g(x) in Equation (13) associated with conventional architecture $\gamma$ is any primitive element and j ranges from b to b+2E−1. The number of multiplications per symbol shift is approximately halved by selecting a g(x) with E pairs of reciprocal roots.

Reciprocal root pairs in Equation (20) are $$\gamma^{b+i}\gamma^{(b+2E-1)-i}=1=\gamma^N \text{ for } 0\leq i<E \tag{21}$$

and $$2b+2E-1=N=2^J-1 \text{ b}=2^{J-1}-E \tag{22}$$

from which b and b+2E−1 are determined given J (bits per symbol) and E (symbol error-correction capability)

EXAMPLE 7

Given J=4 and E=3, parameters of a (15,9) RS code employing Berlekamp encoder architecture shown in FIG. 2. The $\log_\alpha$ and binary representations of the RS symbols in $GF(2^4)$ defined by the field generator polynomial $$F_B(x)=x^4+x^3+1$$

are given in TABLE I. A degree 6 generator polynomial is derived for $\gamma=\alpha^4$ in Equation (20). From Equations (21) and (22)

$$b = 2^3 - 3 = 5 \text{ and } b + 2E - 1 = 10 \tag{23}$$

and $$g_2(x) = \prod_{j=5}^{10}(x-\alpha^{4j}) = \sum_{i=0}^{6} G_i x^i =$$

$$(x-\alpha^5)(x-\alpha^9)(x-\alpha^{13})(x-\alpha^2)(x-\alpha^6)(x-\alpha^{10}) =$$

$$x^6 + \alpha^4 x^5 + \alpha^2 x^4 + \alpha^{11} x^3 + \alpha^2 x^2 + \alpha^4 x + 1$$

Note that the coefficient string of $g_2(x)$ in (23) is palindromic since $$x^6 g_2(1/x)=g_2(x)$$

is a self-reciprocal polynomial over $GF(2^4)$. Thus $$G_0 = (G_6) = 1$$
$$G_1 = G_5 = \alpha^4$$
$$G_2 = G_4 = \alpha^2$$
$$G_3 = \alpha^{11}$$

represent the fixed multipliers. A multiplier $G_i=\alpha^0=1$ corresponds to a wire (in either conventional or Berlekamp encoder hardware) and does not incur a cost. In Berlekamp architecture $G_O=(G_{2E})$ necessarily equals $\alpha^0=1$ and there are at most E distinct nonzero fixed multipliers excluding $\alpha^0$. Whereas in conventional architecture there are at most 2E distinct nonzero fixed multipliers.

The number of distinct possible self-reciprocal generator polynomials g(x) of degree 2E is $\phi(2^J-1)/2$ for any J and E where $(2^J-1)-2E\geq 3$. For each $\gamma(\alpha^s$ in Equation (20)) its reciprocal $\gamma^{-1}$ (i.e., $\alpha^{-s}=\alpha^{N-s}$) yields the same g(x). In this example there are $\phi(15)=8$ distinct choices in selecting $\gamma$ resulting in four distinct possible self-reciprocal generator polynomials $g_2(x)$.

As is the case for conventional (encoder) architecture, coefficients of the generator polynomial associated with Berlekamp architecture are represented as $$\alpha^i=b_{r-1}\alpha^{r-1}+b_{r-2}\alpha^{r-2}+\ldots+b_0 \text{ where } b_j \in GF$$
(2)

in $GF(2^r)$. See Table I and Example 7 for r=4. However, unlike the case for conventional architecture, information symbols and check symbols are represented in basis $\{l_j\}$ the dual basis of $\{\lambda^k\}$ discussed above in the section on Berlekamp's Representation of RS Symbols Using the Concept of Trace and Berlekamp's Dual Basis.

$$a^i \longleftrightarrow \sum_{j=0}^{r-1} v_j l_j$$

where $$v_k = Tr(\lambda^k a^i)$$

for a selected element $\lambda$ in $GF(2^r)$ where $\lambda$ is not a member of a subfield.

Referring to FIG. 2, a linear binary matrix 10 (i.e., an array of Exclusive-OR gates) with J inputs and E+2 outputs is used to perform the multiplication of a J-bit RS symbol (in the feedback path) stored in a z register 12 with each of the coefficients $$G_0 = (G_{2E}), G_1 = G_{2E-1}, \ldots, G_{E-1} = G_{E+1}, G_E$$

of $g_2(x)$. The components of z (an RS symbol represented in $\{l_j\}$) are $$z_0, z_1, \ldots z_{J-1}$$

Note that substituting $z_i$ for $v_i$ gives $$a^i \longleftrightarrow \sum_{j=0}^{r-1} z_j l_j \text{ and } \lambda^k a^i \longleftrightarrow \sum_{j=0}^{r-1} z_j \lambda^k l_j$$

where $a^i$ is the corresponding representation of the RS symbol (i.e., field element) z. Thus, as in Equation (11), $z_k$ in $\{l_j\}$ is computed by $$Tr(\lambda^k a^i) \longleftrightarrow \sum_{j=0}^{r-1} z_j Tr(\lambda^k l_j) = z_k$$

At a given time interval the representation of a field element z in basis $\{l_j\}$ is entered and stored in register z. The respective outputs of the linear binary matrix are $$\begin{aligned} T_0 &= Tr(zG_0) \\ T_1 &= Tr(zG_1) \\ &\vdots \\ T_E &= Tr(zG_E) \end{aligned} \tag{24}$$

These outputs represent $$z_0^{(0)}, z_0^{(1)}, \ldots, z_0^{(E)} \tag{25}$$

the first component (bit) in basis $\{l_j\}$ of each of the products $$zG_0, zG_1, \ldots, zG_E \tag{26}$$

respectively. Condensed symbolism associated with expressions of the form appearing in Equations (24), (25) and (26) proposed by Berlekamp appear in Perlman and Lee, supra. The condensed symbolism is introduced here in an attempt to complete the description of the operation of the linear binary matrix.

$$\{z_0^{(l)}\} \text{ for } 0 \leq l \leq E$$

is the equivalent of Equation (25). Whereas $\{zG_l\}$ is a condensed representation of Equation (26).

$$T_l(z) = Tr(zG_l)$$

denotes J successive sets of E simultaneous outputs (bit per output) in computing $\{zG_l\}$ in basis $\{l_j\}$. Since $zG_l$ is representable in basis $\{l_j\}$ the dual basis of $\{\lambda^k\}$ $$zG_l = \sum_{j=0}^{r-1} z_j^{(l)} l_j \tag{27}$$

and $$Tr[\lambda^k(zG_l)] = \sum_{j=0}^{r-1} z_j^{(l)} Tr(\lambda^k l_j) = T_l(\lambda^k z) = z_k^{(l)}$$

At (time interval) $k=0$, the simultaneous outputs $\{T_l\}$ in Equation (24) are $\{z_0^{(l)}\}$ (in Equation (25)), the first component (bit) of each of the products $\{zG_l\}$ in Equation (26). At $k=1$, the stored symbol z (in FIG. 2) is replaced by $\lambda z$ where $\lambda z$ is derived from z (as will be shown). The simultaneous outputs $\{T_l\}$ are $\{z_1^{(l)}\}$, the second component (bit) of each of the products $\{zG_l\}$. Similarly at $k=2$, $\lambda z$ is replaced by $\lambda(\lambda z)$ and $\{T_l\}$ yields the third component of $\{G_l\}$ and so on.

The form of the $\{T_l\}$ functions follows from Equation (27) and is $$T_l(z) = Tr(zG_l) = \sum_{j=0}^{r-1} z_j Tr(l_j G_l) \tag{28}$$

For every z, the output $T_l$ for a given l is the sum modulo 2 (Exclusive-OR) of those components $z_j$'s in the dual basis for which $$Tr(l_j G_l) = 1$$

The output $Tr(\lambda^J z)$ in FIG. 2 which is fed back to the z register is used in deriving $\lambda z$. The field element z may be represented as $a^i$ or in basis $\{l_j\}$ in vector form as $$z = Tr(z), Tr(\lambda z), \ldots, Tr(\lambda^{J-1} z)$$

where $$Tr(\lambda^k z) = Tr(\lambda^k a^i) = z_k$$

and $$z = Tr(\lambda z), Tr(\lambda^2 z), \ldots, Tr(\lambda^J z)$$

By shifting the bits stored in the z register in FIG. 2 upward one position and feeding back the output (of the linear binary matrix) $Tr(\lambda^J z)$, $\lambda z$ is derived from z. This corresponds to $$z_i \leftarrow z_{i+1} \text{ for } 0 \leq i < J \; z_{J-1} \leftarrow z_J = Tr(\lambda^J z)$$

EXAMPLE 8

The design of the linear binary matrix for the (15,9) RS code introduced in Example 7 is the subject of this example. One argument for each $\{T_l\}$ function is the set of distinct unit vectors in $\{l_j\}$ $$\{l_0, l_1, l_2, l_3\} = \{a^8, a^{10}, a^7, a^{14}\}$$

expressed as $a^i$. See Table IV where components $z_i$ are substituted for coefficients $v_i$. The other argument is a distinct coefficient $$\{G_0, G_1, G_2, G_3\} = \{a^0, a^4, a^2, a^{11}\}$$

of the self-reciprocal generator polynomial $g_2(x)$ in Equation (23).

The following table yields the desired $\{T_j\}$ linear functions of the $z_i$ components.

| j | 0 | 1 | 2 | 3 | |
|---|---|---|---|---|---|
| $1/G_0$ | $\alpha^8$ | $\alpha^{10}$ | $\alpha^7$ | $\alpha^{14}$ | |
| $Tr(1/G_0)$ | 1 | 0 | 0 | 0 | $T_0 = z_0$ |
| $1/G_1$ | $\alpha^{12}$ | $\alpha^{14}$ | $\alpha^{11}$ | $\alpha^3$ | |
| $Tr(1/G_1)$ | 1 | 0 | 0 | 1 | $T_1 = z_0 + z_3$ |
| $1/G_2$ | $\alpha^{10}$ | $\alpha^{12}$ | $\alpha^9$ | $\alpha$ | |
| $Tr(1/G_2)$ | 0 | 1 | 1 | 1 | $T_2 = z_1 + z_2 + z_3$ |
| $1/G_3$ | $\alpha^4$ | $\alpha^6$ | $\alpha^3$ | $\alpha^{10}$ | |
| $Tr(1/G_3)$ | 1 | 1 | 1 | 0 | $T_3 = z_0 + z_1 + z_2$ |

The output of the linear binary matrix $Tr(\lambda^J \alpha^i)$ (where $J=4$ and $\lambda=\alpha^6$), which is fed back when computing $\lambda z$, is derived from Table IV as follows:

| $z_0$ | $z_1$ | $z_2$ | $z_3$ | $\alpha^i$ | $\lambda^4 \alpha^i = \alpha^{9+i}$ | $Tr(\lambda^4 \alpha^i)$ |
|---|---|---|---|---|---|---|
| 1 | 0 | 0 | 0 | $\alpha^8$ | $\alpha^2$ | 1 |
| 0 | 1 | 0 | 0 | $\alpha^{10}$ | $\alpha^4$ | 1 |
| 0 | 0 | 1 | 0 | $\alpha^7$ | $\alpha$ | 1 |
| 0 | 0 | 0 | 1 | $\alpha^{14}$ | $\alpha^8$ | 1 |

Thus, $Tr(\lambda^4 \alpha^i) = z_0 + z_1 + z_2 + z_3 (= z_4)$

This completes the logical description of the linear binary array for the (15,9) RS code presented in Example 7. An implementation is given in FIG. 3 in the form of a functional logic diagram. By (Exclusive-OR) gate sharing, the total of number of gates is reduced to 5.

Berlekamp architecture eliminates all firmware required by conventional architecture for multiplying a field element (RS Symbol) by a set of fixed field elements (corresponding to coefficients of the generator polynomial). The firmware is replaced by the linear binary array 10 whose complexity is governed by the selected field generator polynomial, the basis $\{\lambda^k\}$ whose dual basis is $\{l_j\}$, and the self-reciprocal generator polynomial. For a given E (symbol error-correction capability) these selections are totally independent. Following is the total number of ways these parameters can be chosen for a J (bits per symbol) of 4 and 8.

| | No. of Ways of Selecting | | | Combined Independent |
|---|---|---|---|---|
| J | $F_B(x)$ | $g_2(x)$ | $\lambda$ | Selections |
| 4 | 2 | 4 | 12' | 96 |
| 8 | 16 | 64 | 240 | 245,760 |

In $GF(2^8)$, the subfield $GF(2^4)$ of 16 elements contains $GF(2^2)$ which contains $GF(2)$. Thus $\lambda$ can be selected from 240 elements in $GF(2^8)$ each of which is not a member of $GF(2^4)$. For a given $F_B(x)$ and $g_2(x)$ Berlekamp used a computer search to obtain a complexity profile of the linear binary array for a (255,223) RS code. This enabled him to select a region where $\lambda$, $F_G(x)$ and $g_2(x)$ led to a linear binary array of minimal complexity.

In FIG. 2, a y register 14 is essentially an extension of register section $2E-1$ and serves as a staging register. After the products $\{zG_j\}$ have been determined, register z is reloaded with the contents of y the next symbol to be fed back. Until all information symbols have been entered and simultaneously delivered to the channel, the y input is the bit-by-bit Exclusive-OR of the bits comprising the information symbol being entered and the bits of the symbol exiting register section $S_{2E-j}$. After the last information symbol has been entered, the mode is changed by a mode switch MSW from information to check, and the 2E check symbols are delivered bit-serially to the channel. Register sections $S_0, S_1, \ldots, S_{2E-1}$ reside in RAM's. The linear binary array 10 allows simultaneous bit-serial multiplication and addition sum modulo 2 with corresponding components of bit shifted symbols in each register section. It effectively realizes bit-serial multiplication of an arbitrary RS symbol with a set of fixed multipliers. The register stages $S_0, S_1, \ldots S_{2E-1}$ play the same role as corresponding register stages in FIG. 1. Similarly, addersA$_1, \ldots$, A$_{2E-1}$ and A$_{in}$ play a similar role as adders in FIG. 1.

EXAMPLE 9

| | z | $\lambda z$ | $\lambda^2 z$ | $\lambda^3 z$ |
|---|---|---|---|---|
| $z_0$ | 0 | 0 | 0 | 1 |
| $z_1$ | 0 | 0 | 1 | 1 |
| $z_2$ | 0 | 1 | 1 | 0 |
| $z_3$ | 1 | 1 | 0 | 0 |

Columns (left to right) are successive contents of the z register after first nonzero information symbol is entered.

| | | | | | | | | | | | | | | | | | |
|---|---|---|---|---|---|---|---|---|---|---|---|---|---|---|---|---|---|
| $C_{14}$ | 0 | 0 | 0 | 0 | 0 | 0 | 0 | 0 | 0 | 0 | 0 | 0 | 0 | 0 | 0 | 0 | $\alpha^*$ |
| $C_{13}$ | 0 | 0 | 0 | 0 | 0 | 0 | 0 | 0 | 0 | 0 | 0 | 0 | 0 | 0 | 0 | 0 | $\alpha^*$ |
| . | | | | | | | | | | | | | | | | | |
| . | | | | | | | | | | | | | | | | | |
| $C_6$ | 0 | 0 | 0 | 1 | 0 | 0 | 0 | 1 | 0 | 0 | 0 | 1 | 0 | 0 | 0 | 1 | $\alpha^{14}$ |
| $C_5$ | 1 | | | | 1 | 1 | | | 1 | 1 | 0 | | 1 | 1 | 0 | 1 | $\alpha^3$ |
| $C_4$ | 1 | | | | 1 | 0 | | | 1 | 0 | 0 | | 1 | 0 | 0 | 1 | $\alpha$ |
| $C_3$ | 0 | | | | 0 | 1 | | | 0 | 1 | 0 | | 0 | 1 | 0 | 0 | $\alpha^{10}$ |
| $C_2$ | 1 | | | | 1 | 0 | | | 1 | 0 | 0 | | 1 | 0 | 0 | 1 | $\alpha$ |
| $C_1$ | 1 | | | | 1 | 1 | | | 1 | 1 | 0 | | 1 | 1 | 0 | 1 | $\alpha^3$ |
| $C_0$ | 0 | | | | 0 | 0 | | | 0 | 0 | 0 | | 0 | 0 | 0 | 1 | $\alpha^{14}$ |
| | ↑ | | | | ↑ | | | | ↑ | | | | ↑ | | | | |
| | $T_0(z)$ | | | | $T_1(z)$ | | | | $T_2(z)$ | | | | $T_3(z)$ | | | | |

The foregoing tables are associated with the encoding of the information symbol sequence $C_{14}$ $C_{13}$ $\ldots$ $C_6$
0  0  $\ldots$  1    Info. Symb. in Basis $\{l_j\}$ Expressed in Hex.

The encoder in FIG. 2 (where $J=4$ and $E=3$) is initially cleared and in the information mode. The last symbol $C_6$ to enter the encoder is the only nonzero symbol among nine information symbols. Previous all zero (0 0 0 0) symbols have no affect on the initial zero states of the registers y and z and the register sections $S_5, S_4, \ldots, S_0$. Symbol $C_6$ is entered and stored (via the y register) in the z register. (Since register section $S_5$ contains 0 0 0 0 upon entering $C_6$, the bit-by-bit Exclusive-OR of the two symbols leaves $C_6$ unchanged). The contents of the z register after $C_6$ is entered is shown in the first of the foregoing tables under column heading z, where $$z_0 = z_1 = z_2 = 0 \text{ and } z_3 = 1$$

The following $\{T_j\}$ functions derived in Example 8

$$
\begin{aligned}
T_0 &= z_0 \\
T_1 &= z_0 \qquad\qquad + z_3 \\
T_2 &= \qquad z_1 + z_2 + z_3 \\
T_3 &= z_0 + z_1 + z_2
\end{aligned}
\qquad (29)
$$

are the first set of outputs (with the current components of the z register as arguments). These are $$z_0^{(0)} = (z_0^{(6)}) = 0 \quad z_0^{(2)} = z_0^{(4)} = 1$$
$$z_0^{(1)} = z_0^{(5)} = 1 \quad z_0^{(3)} = 0$$

the first respective components of check symbols $C_0$, $C_1, \ldots, C_5$ in the second table of this example. As previously discussed the $\{T_j\}$ outputs in (29) occur simultaneously. The last (bit) entry in the column identified as $$T_0(z) = Tr(zG_0)$$

is the first component of check symbol $C_O$. After computing the first components of $T_j(z) = Tr(zG_j)$ in (28) for $j=0$, the contents of the z register is shifted upward one (bit) position with $z_3$ replaced by $$
\begin{aligned}
Tr(\lambda^4 \alpha^i) &= z_0 + z_1 + z_2 + z_3 = z_4 \\
&= 0 + 0 + 0 + 1 = 1 = z_4
\end{aligned}
$$

The new contents of the z register appears in the first table of this example under the column heading $\lambda z$. The second components of $T_j(z) = Tr(zG_j)$ in (28) for $j=1$ are similarly computed and tabulated in the lower table. The second component of check symbol $C_O$ when first computed (along with the second components of all the other check symbols) is the last bit in the column identified as $$T_1(z) = Tr(\lambda z G_0)$$

Encoding continues until all four components of each check symbol have been computed in basis $\{l_j\}$ as shown in the lower table. The information symbols and check symbols of the (15,9) RS codeword are in basis $\{l_j\}$. Their corresponding $\alpha^i$ representation appears in the rightmost column of the second table in accordance with TABLE IV. Consider the following representations of the resulting codeword.

| $C_{15}$ | $C_{14}$ | ... | $C_7$ | $C_6$ | $C_5$ | $C_4$ | $C_3$ | $C_2$ | $C_1$ | $C_0$ | Representation |
|---|---|---|---|---|---|---|---|---|---|---|---|
| 0 | 0 | ... | 0 | 1 | D | 9 | 4 | 9 | D | 1 | Basis $\{l_j\}$ in Hex |
| $\alpha^*$ | $\alpha^*$ | ... | $\alpha^*$ | $\alpha^{14}$ | $\alpha^3$ | $\alpha$ | $\alpha^{10}$ | $\alpha$ | $\alpha^3$ | $\alpha^{14}$ | $\{\alpha^i\}$ |

The representation in powers of $\alpha$ corresponds to the polynomial $$P(x) = \alpha^{14}x^6 + \alpha^3 x^5 + \alpha x^4 + \alpha^{10}x^3 + \alpha x^2 + \alpha^3 x + \alpha^{14}$$

Comparing $P(x)$ with the code's generator polynomial $$g_2(x) = x^6 + \alpha^4 x^5 + \alpha^2 x^4 + \alpha^{11} x^3 + \alpha^2 x^2 + \alpha^4 x + 1$$

reveals that $P(x)$ is a scalar multiple of $g_2(x)$—i.e., $$P(x) = \alpha^{14}[g_2(x)] = C(x)$$

a codeword polynomial.

STATEMENT OF THE INVENTION

Mappings between codewords of two distinct (N,K) Reed-Solomon codes over $GF(2^J)$ having selected two independent parameters: J, specifying the number of bits per symbol; and $E_1$, the symbol error correction capability of the code, is provided. The independent parameters J and E yield the following: $N = 2^J - 1$, total number of symbols per codeword; 2E, the number of symbols assigned a role of check symbols; and $K = N - 2E$, the number of code symbols representing information, all within a codeword of an (N,K) RS code over $GF(2^J)$. Having selected those parameters for encoding, the implementation of a decoder is governed by: $2^J$ field elements defined by a degree J primitive polynomial over $GF(2)$ denoted by $F(x)$; a code generator polynomial of degree 2E containing 2E consecutive roots of a primitive element defined by $F(x)$; and, in a Berlekamp RS code, the basis in which the RS information and check symbols are represented.

The process for transforming words $R_B$ in a conventional code for decoding the words $R_G$ having possible errors to codewords $C_G$ free of error is accomplished in a sequence of transformations leading to decoding $R_G$ to $C_G$, and inverse transformations of those same transformations in a reverse sequence leading to converting the codewords $C_G$ to codewords $C_B$, thus decoding the Berlekamp codewords $R_G$. Thus, the corrected codewords $C_G$ are reverse transformed symbol-by-symbol back into codewords $C_B$ in the Berlekamp code. The uncorrected words in the Berlekamp code and the conventional code are here denoted by the letter R with subscripts B and G, respectively, because they are with possible error. Until corrected, they are not denoted codewords by the letter C with first the subscript G and later in the process the subscript B. The codewords $C_G$ are not information, because in the process of transformation from $R_B$ to $R_G$ for decoding (i.e., correcting errors) they have undergone permutation. To retrieve the information, the codewords $C_G$ must be transformed back into codewords $C_B$ by inverse transformation in a reverse order of process steps.

BRIEF DESCRIPTION OF THE DRAWINGS

FIGS. 4a through 4d illustrate a flow chart of a sequence of transformations and their respective inverses in reverse order, in accordance with the present invention.

DETAILED DESCRIPTION OF THE INVENTION

Figure 1:
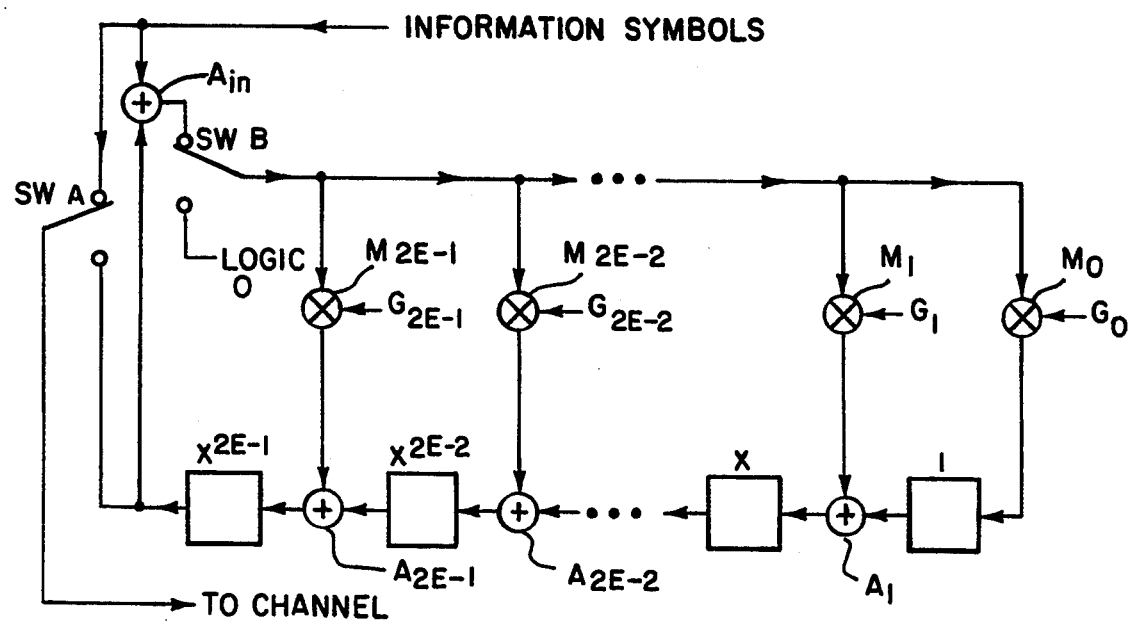
FIG. 1 illustrates a conventional (N,K) RS encoder.
Figure 3:
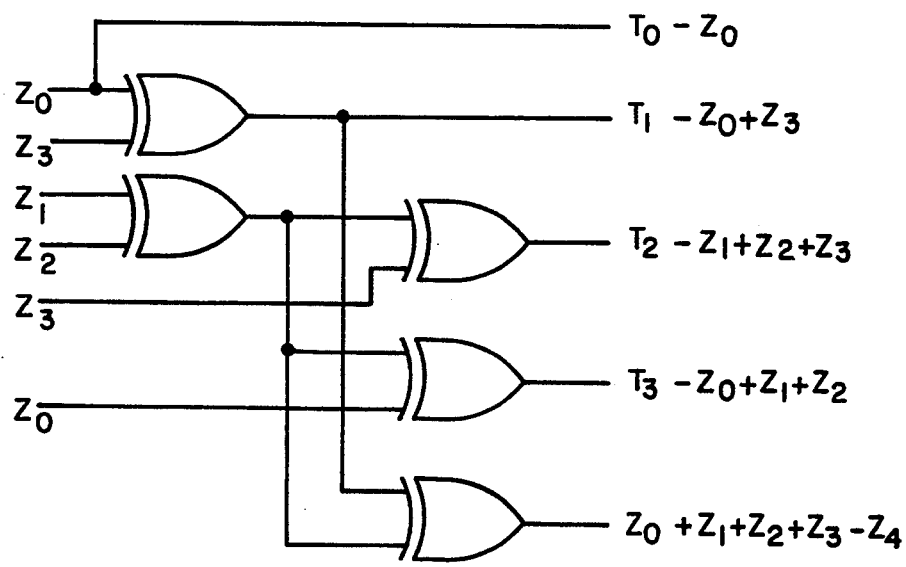
FIG. 3 is a logic diagram of a linear binary matrix for a (15,9) RS Berlekamp encoder.

The Mathematical Equivalence of (N,K) Reed-Solomon Codes

Before proceeding with a detailed description of the invention, the transformational equivalence of Berlekamp and conventional RS codes for (N,K)=(15,9) will be described as one example of an (N,K) RS code GF($w^4$). Then a succession of transformations will be described that, in accordance with the present invention, map any given codeword of a (255,223) RS Berlekamp code B to a codeword of a (255,223) RS code. (Conventional code G). This allows the use of one ground decoder (associated with code G) which is conservatively an order of magnitude more complex than its associated encoder to serve as a decoder for the two distinct (255,223) RS codes. The succession of transformations that map a received word (which may be erroneous) originating from code B to one of code G (with the number of erroneous symbols unchanged) is completed before decoding. After decoding where symbol errors, if any, have been corrected, the entire codeword (now a member of code G) is subjected to the inverse of each of the above transformations in reverse order to recover the received codeword in Code B in order to recover the codeword originating from code B (corrected if originally erroneous). A received word originating from code G is decoded directly. B in code B denotes Berlekamp's representations associated with Berlekamp encoder architecture. Whereas G in code G denotes representations associated with pre-Berlekamp or "conventional" architecture.

The mathematical description of two (15,9) RS codes are summarized as follows:

1. Code B
$F_B(x) = X^4 + X^3 + 1$ Field Generator Polynomial $$g_2(x) = \prod_{j=5}^{10} (x - \alpha^{4j}) = \sum_{i=0}^{6} G_i x^i \quad \text{Code Generator Polynomial}$$

$$= (x - \alpha^5)(x - \alpha^9)(x - \alpha^{13})(x - \alpha^2)(x - \alpha^6)(x - \alpha^{10})$$
$$= x^6 + \alpha^4 x^5 + \alpha^2 x^4 + \alpha^{11} x^3 + \alpha^2 x^2 + \alpha^4 x + 1$$

$\{1, \lambda, \lambda^2, \lambda^3\} = \{1, \alpha^6, \alpha^{12}, \alpha^3\}$  Basis $\{\lambda^k\}$ $\{l_0, l_1, l_2, l_3\} = \{\alpha^8, \alpha^{10}, \alpha^7, \alpha^{14}\}$  $\{l_j\}$ Dual Basis of $\{\lambda^k\}$ -continued 2. Code G $F_G(x) = x^4 + x + 1$ Field Generator Polynomial $$g_1(x) = \prod_{j=1}^{6} (x - \beta^j) = \sum_{i=0}^{6} G_i x^i \quad \text{Code Generator Polynomial}$$

$$g_1(x) = x^6 + \beta^{10} x^5 + \beta^{14} x^4 + \beta^4 x^3 + \beta^6 x^2 + \beta^9 x + \beta^6$$

Each (of the 9) 4-bit information symbols of any (15,9) RS code is independently selected among 16 possible symbols in GF($2^4$) defined by the code's field generator polynomial. Each (of the 6) check symbol is a linear combination of a distinct subset of information symbols and thus are defined by the information symbols and, therefore, dependent. Thus the size of a (15,9) RS codeword dictionary is $$(2^4)^9 = 2^{36} \approx 6.87 \times 10^{10} \text{ codewords}$$

There is a one-to-one correspondence between the codewords of two different (N,K) RS codes.

Given the information symbol sequence represented in hexadecimal

| i of $C_i$ | 14 | 13 | 12 | 11 | 10 | 9 | 8 | 7 | 6 |
|---|---|---|---|---|---|---|---|---|---|
| $\{l_j\}$ in Hex | 7 | 0 | 0 | 0 | 0 | 0 | 0 | 0 | 0 | encoding the information symbol sequence using an encoder with Berlekamp architecture results in the Code B codeword

| i of $C_i$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $\{l_j\}$ in Hex | 7 | 0 | 0 | 0 | 0 | 0 | 0 | 0 | 0 | 7 | A | C | 6 | C | A | where each 4-bit symbol is a basis $\{l_j\}$ symbol expressed in Hexadecimal.

The first transformation to be applied to a Code B codeword is the mapping of each symbol from its basis $\{l_j\}$ representation to its corresponding $$\alpha^i = b_3 \alpha^3 + b_2 \alpha^2 + b_1 \alpha^1 + b_0 \alpha^0$$

representation as given in TABLE IV. The $\log_\alpha$ of $\alpha^i$ (i.e., i) is (and has been) used to represent the binary symbol $b_3\ b_2\ b_1\ b_0$ where appropriate.

EXAMPLE 10

Consider the Code B codeword

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $\{l_j\}$ in Hex | 7 | 0 | 0 | 0 | 0 | 0 | 0 | 0 | 0 | 7 | A | C | 6 | C | A |

By table look-up or the linear transformation discussed above under the heading "Berlekamp's Representation of RS Symbols Using the Concept of a Trace," the basis $\{l_j\}$ symbols are transformed to their respective $\alpha^i$ representations to yield the Code B.1 codeword

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $\{l_j\}$ in Hex | 7 | 0 | 0 | 0 | 0 | 0 | 0 | 0 | 0 | 7 | A | C | 6 | C | A |

| i of $\alpha^i$ | 0 | * | * | * | * | * | * | * | * | 0 | 4 | 2 | 11 | 2 | 4 |

Note that Code B.1 is a (15,9) RS code with the following mathematical description:

$$F_{B.1}(x) = F_B(x) = x^4 + x^3 + 1$$

$$g_{2.1}(x) = g_2(x) = \prod_{j=5}^{10} (x - \alpha^{4j})$$

$$= x^6 + \alpha^4 x^5 + \alpha^2 x^4 + \alpha^{11} x^3 + \alpha^2 x^2 + \alpha^4 x + 1$$

Code B.1 has the same field and code generator polynomial (which is self-reciprocal) as Code B. The encoder associated with Code B.1 is of the "conventional" type, a codeword denoted $C_{B.1}(x)$ in the following equation.

$$C_{B.1}(x) = x^{14} + x^5 + \alpha^4 x^4 + \alpha^2 x^3 + \alpha^{11} x^2 + \alpha^2 x + \alpha^4 \quad (30)$$

is from Example 10 a codeword polynomial belonging to Code B.1 which contains $g_{2.1}(x) = g_2(x)$ as a factor. The symbol-by-symbol transformation from the basis $\{1_j\}$ representation in binary to its corresponding $\alpha^i$ representation in binary (i.e., $\alpha$basis) is $$[v_0\ v_1\ v_2\ v_3]T_{l\alpha} = [b_3\ b_2\ b_1\ b_0]$$

where $$T_{l\alpha} = \begin{bmatrix} 1 & 1 & 1 & 0 \\ 1 & 0 & 1 & 0 \\ 0 & 1 & 1 & 1 \\ 1 & 1 & 0 & 0 \end{bmatrix}$$

is the linear transformation matrix. For example $$[1\ 1\ 1\ 0]T_{l\alpha} = [0\ 0\ 1\ 1] = \alpha^{12}$$

as may be verified in TABLE IV.

The second transformation in the sequence is related to the translation of the powers of the roots in $g_{2.1}(x)$ ($= g_2(x)$) which was first derived in R. L. Miller and L. J. Deutsch, "Conceptual Design for a Universal Reed-Solomon Decder," *IEEE Transactions on Communications,* Vol. Com-29, No. 11, pp. 1721–1722, November 1981, for the general case. Given $$g_{2.1}(x) = \prod_{j=5}^{10} (x - \gamma^j) = \prod_{j=1}^{6} (x - \gamma^{j+4})$$

where $\gamma = \alpha^4$.

Changing the argument from x to $\gamma^4 x$ yields $$g_{2.1}(\gamma^4 x) = \prod_{j=1}^{6} (\gamma^4 x - \gamma^4 \gamma^j) = \gamma^9 \prod_{j=1}^{6} (x - \gamma^j)$$

where $(\gamma^4)^6 = \gamma^{24} = 9 \bmod 15$ and $\gamma^4 = \alpha$.

The generator polynomial $g_{2.2}(x)$ derived from $g_{2.1}(x)$ defines the (15,9) RS Code B.2.

Given $C_{B.1}(x)$ a Code B.1 codeword polynomial. Thus $$g_{2.1}(x) | C_{B.1}(x) \text{ and } C_{B.1}(x) = u(x)g_{2.1}(x) \text{ over } GF(2^4)$$

defined by $F_{B.1}(x)$ ($= F_B(x)$). Then $$\gamma^{-9} C_{B.1}(\alpha x) = u(\alpha x)[\gamma^{-9} g_{2.1}(\alpha x)] = u(\alpha x) g_{2.2}(x)$$

and $$C_{B.1}(\alpha x) = \gamma^9 u(\alpha x) g_{2.2}(x)$$

since $g_{2.2}(x) | C_{B.1}(\alpha x)$, $C_{B.1}(\alpha x)$ is a Code B.2 codeword polynomial.

Code B.2 is a (15,9) RS code with the following mathematical description:

$$F_{B.2}(x) = F_{B.1}(x) = F_B(x) = x^4 + x^3 + 1 \quad (31)$$

$$g_{2.2}(x) = \prod_{j=1}^{6} (x - \alpha^{4j})$$

$$= x^6 + \alpha^3 x^5 + x^4 + \alpha^8 x^3 + \alpha^{13} x^2 + \alpha^{14} x + \alpha^9$$

The encoder associated with Code B.2 is of the "conventional" type. The generator polynomial $g_{2.2}(x)$ provides a test for any codeword polynomial $C_{B.2}(x)$ derived from the transformation $C_{B.1}(\alpha x)$. Dividing $C_{B.2}(x)$ by $g_{2.2}(x)$ in (31) over $GF(2^4)$ defined by $F_{B.2}(x) = (F_B(x))$ results in a zero remainder.

EXAMPLE 11

From Example 10 and Equation (30)

$$C_{B.1}(x) = x^{14} + x^5 + \alpha^4 x^4 + \alpha^2 x^3 + \alpha^{11} x^2 + \alpha^2 x + \alpha^4$$

$$C_{B.1}(x) = (\alpha x)^{14} + (\alpha x)^5 + \alpha^4 (\alpha x)^4 + \alpha^2 (\alpha x)^3 + \alpha^{11}(\alpha x)^2 + \alpha^2 \alpha x + \alpha^4$$

$$= \alpha^{14} x^{14} + \alpha^5 x^5 + \alpha^8 x^4 + \alpha^5 x^3 + \alpha^{13} x^2 + \alpha^3 x + \alpha^4$$

$$= C_{B.2}(x)$$

It may be verified that $$C_{B.2}(x) = (\alpha^{14} x^8 + \alpha^2 x^7 + \alpha^7 x^6 + \alpha^4 x^5 + \alpha^4 x^4 + \alpha^3 x^3 + \alpha x^2 + \alpha^2 x + \alpha^{10}) g_{2.2}(x)$$

over $GF(2^4)$ defined by $F_{B.2}(x)$ ($= F_B(x)$). The generator polynomial $g_{2.2}(x)$ appears in (31).

The outcomes of successive transformations, thus far, on codeword (symbols) $C_B$ in Example 10 are:

| k of Ck | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $C_B$ | 7 | 0 | 0 | 0 | 0 | 0 | 0 | 0 | 0 | 7 | A | C | 6 | C | A |
| $C_{B.1}$ | 0 | * | * | * | * | * | * | * | * | 0 | 4 | 2 | 11 | 2 | 4 |

| | | | | | | | | | | | | | | | |
|---|---|---|---|---|---|---|---|---|---|---|---|---|---|---|---|
| $C_{B.2}$ | 14 | * | * | * | * | * | * | * | * | 5 | 8 | 5 | 13 | 3 | 4 |

The binary symbols of $C_B$ are in basis $\{l_j\}$ represented in hexadecimal. Whereas the binary symbols in $C_{B.1}$ and $C_{B.2}$ are represented by i of $\alpha^i$ in the same $GF(2^4)$ where $F_B(\alpha)=0$.

The transformation related to the translation of the powers of the roots involves a change in the magnitude of $s_k$ in $\alpha^{SK}$ of a coefficient of $x^k$ (when $\alpha^{SK}$ and k are nonzero) which is dependent upon the magnitude of k. An all zeros coefficient ($\alpha^*$) and $C_O$ the constant term of a codeword polynomial are unaffected. Given the fixed vector $$14, 13, \ldots, 1, 0$$

representing the powers of x of any (15,9) codeword polynomial and $$s_{14}, s_{13}, \ldots, s_1, s_0$$

the $\log_\alpha$ of respective coefficients of codeword polynomial $C_{B.1}(x)$. Then the $\log_\alpha$ of the coefficient of $x^k$ of $C_{B.2}(x)$ (i.e., $C_{B.1}(\alpha x)$) is $$k+s_k \bmod 15 \text{ and for } s_k=*, k+*=*$$

The description of the succession of transformations for the one-to-one mapping of $C_B(x)$ to $C_G(x)$ continues. A change in the primitive element $\alpha$ is required in $$g_{2.2}(x) = \prod_{j=1}^{6} (x - \alpha^{4j}) \tag{31a}$$

in preparation for the one-to-one mapping of RS symbols (i.e., field elements) in $GF(2^4)$ defined by $F_B(x)$ in (5) to RS symbols in $GF(2^4)$ defined by $F_G(x)$ in (6). See Table III.

An element $\alpha^y$ is sought whereby $$(\alpha^y)^4 = \alpha^{13} \text{ or } 4y \equiv 13 \bmod 15 \tag{32}$$

From number theory, for integers b, c and n $$by \equiv c \bmod n$$

has solution(s) in y if and only if (b,n)|c and the number of distinct solutions is (b,n). Since (4,15)=1 there is a unique solution for y in (32), namely, y=7. Clearly was selected in deriving one of 4 distinct self-reciprocal generator polynomials, namely, $g_2(x)$ in (23). The choice is one factor affecting the complexity of the linear binary array in FIG. 2. Since i of the $\alpha^i$ candidates is necessarily relatively prime to 15 (i.e., (i,n)=1), a unique solution exists for the congruence in (32) where each i is substituted for 4. The foregoing arguments are applicable in formulating a transformation between any two distinct (N,K) RS codes involving a change in the primitive element. N-K consecutive powers of the changed primitive element are roots of transformed codewords. The correspondence $$\alpha^{13} \rightarrow (\beta^7)^{13} = \beta^{91 \equiv 1 \bmod 15} = \beta \tag{33}$$

as shown in TABLE III is used in a subsequent third transformation which yields $g_1(x)$.

The next transformation is a one-to-one mapping of codewords in Code B.2 onto codewords in Code B.3. The generator polynomial of Code B.3 is $$\begin{aligned} g_{2.3}(x) &= \prod_{j=1}^{6} (x - \alpha^{13j}) \text{ where } \alpha^{13j} = (\alpha^7)^{4j} \\ &= x^6 + \alpha^{10}x^5 + \alpha^2 x^4 + \alpha^7 x^3 + \\ & \quad \alpha^3 x^2 + \alpha^{12} x + \alpha^3 \end{aligned} \tag{34}$$

Codeword polynomials $C_{B.3}(x)$ must contain all the roots of $g_{2.3}(x)$ in order to contain $g_{2.3}(x)$ as a factor. Thus $$C_{B.3}(\alpha^{13j}) = C_{B.3}[(\alpha^7)^{4j}] = 0 \text{ for } j=1, 2, \ldots, 6 \tag{35}$$

and $C_{B.3}(x)$ is derived from $C_{B.2}(x)$ by a permutation of the (symbol) coefficients of $C_{B.2}(x)$. The permutation of the symbols of the latter is $$C_{[B.2]k} \rightarrow C_{[B.2]13k} = C_{[B.3]k} \text{ for } k=0, 1, \ldots, 14 \tag{36}$$

where 13 k is reduced modulo 15. The permutation accounts for the substitution of $\alpha^7$ for $\alpha$ (resulting in a change in primitive element) to obtain $g_{2.3}(x)$ in Equation (34). Note that 13 (of 13 k in Equation (36) is the multiplicative inverse of 7 modulo 15.

Since (13,15)=1, 13 k modulo 15 is a permutation on the complete residue class k (0 1 . . . 14) modulo 15 as follows:

| 14 | 13 | 12 | 11 | 10 | 9 | 8 | 7 | 6 | 3 | 2 | 1 | 0 | = | k of $C_k$ |
|---|---|---|---|---|---|---|---|---|---|---|---|---|---|---|
| 2 | 4 | 6 | 8 | 10 | 12 | 14 | 1 | 7 | 9 | 11 | 13 | 0 | = | 13k mod 15 |

(7,15)=1 and $\alpha^7$ is primitive.

Recall that $\alpha$ is a primitive root of $F_B(x)$ and that $\alpha^4$ among the candidates of primitive elements $$\alpha (\text{or } \alpha^{14}), \alpha^2 (\text{or } \alpha^{13}), \alpha^4 (\text{or } \alpha^{11}), \alpha^7 (\text{or } \alpha^8)$$

EXAMPLE 12

Given codeword $C_{B.2}$ from Example 11. The permutation $C_{[B.2]13k}$ yields codeword $C_{B.3}$.

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $C_{B.2}$ | 14 | * | * | * | * | * | * | * | * | 5 | 8 | 5 | 13 | 3 | 4 |
| $C_{B.3}$ | * | 3 | * | 13 | * | 5 | * | 8 | * | 5 | * | * | 14 | * | 4 |

Consider the coefficient $C_1 = \alpha^3$ of x in codeword polynomial $C_{B.2}(x)$. Due to the permutation, it becomes the coefficient $C_{13}=\alpha^3$ of $x^{13}$ in codeword polynomial $C_{B.3}(x)$. From Equation (34)

$$\alpha^{13j}=(\alpha^7)^{4j} \text{ must be a root of } C_{B.3}(x) \text{ for } j=1, 2, \ldots, 6$$

Evaluating the term $\alpha^3 x^{13}$ in $C_{B.3}(x)$ for $$x=\alpha^{13}=(\alpha^7)^4 \text{ gives } \alpha^3[(\alpha^7)^4]^{13}=\alpha^3\alpha^4=\alpha^7$$

It will now be shown that the permutation preserves the evaluation of the foregoing term in $C_{B.2}(x)$ for the root $(\alpha^7)^4$. From (31a)

$$\alpha^{4j} \text{ must be a root of } C_{B.2}(x) \text{ for } j=1, 2, \ldots, 6$$

Evaluating the term $\alpha^3 x$ in $C_{B.2}(x)$ for $$x=\alpha^4 \text{ gives } \alpha^3\alpha^4=\alpha^7$$

as asserted.

Consider the coefficient $C_3=\alpha^5$ of $x^3$ in $C_{B.2}(x)$. The evaluation of the term $\alpha^5 x^3$ in $C_{B.2}(x)$ for the root $(\alpha^4)^6$ is $$\alpha^5[(\alpha^4)^6]^3 = \alpha^5[\alpha^{12}] = \alpha^2$$

The coefficient $C_3=\alpha^5$ of $x^3$ in $C_{B.2}(x)$ becomes by permutation the coefficient $C_{3\times 13 \bmod 15}(=C_9)$ of $x^{3\times 13}$ $(=x^9)$ in $C_{B.3}(x)$. The evaluation of the term $\alpha^5 x^{3\times 13}$ in $C_{B.3}(x)$ for the root $[(\alpha^7)^4]^6$ is $$\alpha^5([(\alpha^7)^4]^6)^{3\times 13} = \alpha^5[(\alpha^4)^6]^3 = \alpha^5[\alpha^{12}] = \alpha^2$$

It may be further shown that $$C_{B.3}[(\alpha^7)^{4j}] = C_{B.2}(\alpha^{4j}) = 0 \text{ for } j=1, 2, \ldots, 6$$

where $C_{13k \bmod 15}$ of $C_{B.3}(x)$ equals $C_k$ of $C_{B.2}(x)$ for $k=0, 1, \ldots, 14$ The outcomes of successive transformations, thus far, on codeword (symbols) $C_B$ in Example 10 are:

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $C_B$    | 7  | 0 | 0  | 0  | 0  | 0 | 0 | 0 | 0 | 7 | A | C | 6 | C | A |
| $C_{B.1}$ | 0 | * | *  | *  | *  | * | * | * | * | 0 | 4 | 2 | 11| 2 | 4 |
| $C_{B.2}$ | 14| * | *  | *  | *  | * | * | * | * | 5 | 8 | 5 | 13| 3 | 4 |
| $C_{B.3}$ | * | 3 | *  | 13 | *  | 5 | * | 8 | * | 5 | * | * | 14| * | 4 |

It may be verified that $$C_{B.3}(x) = (\alpha^3 x^7 + \alpha^{13} x^6 + \alpha^{12} x^5 + \alpha^{14} x^4 + \alpha^{13} x^3 + \alpha^{13} x^2 + \alpha^{10} x + \alpha) g_{2.3}(x)$$

over $GF(2^4)$ defined by $F_{B.3}(x)$ ($=F_B(x)$). The generator polynomial $g_{2.3}(x)$ is given in Equation (34). $C_{B.3}$ in addition to $C_{B.1}$ and $C_{B.2}$ is associated with an encoder of the "conventional" type.

The fourth transformation is the one-to-one mapping of symbols in $GF(2^4)$ defined by $F_B(x)$ onto symbols in $GF(2^4)$ defined by $F_G(x)$. The mapping $$\alpha^i \to \beta^{7i}$$

where $$F_B(\alpha)=0 \text{ and } F_G(\beta)=0$$

is discussed above under the heading "Mathematical Characterization of RS Symbols" and appears in TABLE III. By mapping the RS symbols comprising a codeword in Code B.3 the corresponding codeword in Code G is obtained.

The generator polynomials $g_{2.3}(x)$ of $C_{B.3}$ in (34) and $g_1(x)$ of $C_G$ in Equation (19) reflect the foregoing mapping.

$$g_{2.3}(x) = \prod_{j=1}^{6} (x - \alpha^{13j})$$
$$= x^6 + \alpha^{10}x^5 + \alpha^2 x^4 + \alpha^7 x^3 + \alpha^3 x^2 + \alpha^{12} x + \alpha^3$$

$$g_1(x) = \prod_{j=1}^{6} (x - \beta^j)$$
$$= x^6 + \beta^{10}x^5 + \beta^{14}x^4 + \beta^4 x^3 + \beta^6 x^2 + \beta^9 x + \beta^6$$

As first introduced in (32) and (33) where the primitive element change was developed in preparation for the last transformation involving field element conversion $$\alpha^{13j} \to (\beta^7)^{13j} = \beta^{\text{hu } 91j} \equiv j \bmod 15 = \beta^j$$

The mapping of coefficients $\alpha^i$ of $x^j$ to $\beta^{7i}$ of $x^j$ confirms the expanded form of $g_1(x)$.

$$g_{2.3}(x) = \alpha^0 x^6 + \alpha^{10}x^5 + \alpha^2 x^4 + \alpha^7 x^3 + \alpha^3 x^2 + \alpha^{12} x + \alpha^3$$
$$\downarrow \quad \downarrow \quad \downarrow \quad \downarrow \quad \downarrow \quad \downarrow \quad \downarrow$$
$$= \beta^0 x^6 + \beta^{10}x^5 + \beta^{14}x^4 + \beta^4 x^3 + \beta^6 x^2 + \beta^9 x + \beta^6 = g_1(x)$$

Note that $g_{2.3}(x)$ and $g_1(x)$ are codeword polynomials of $C_{B.3}(x)$ and $C_G(x)$, respectively. The transformation (field element conversion) is applicable to every codeword polynomial in $C_{B.3}(x)$. As discussed in the section on "Mathematical Characterization of RS Symbols," the mapping $\alpha^i \to \beta^{7i}$ is realizable by table look-up or by employing the linear transformation matrix $$M_{\alpha\beta} = \begin{bmatrix} 1 & 1 & 0 & 0 \\ 1 & 0 & 0 & 1 \\ 1 & 0 & 1 & 1 \\ 0 & 0 & 0 & 1 \end{bmatrix}$$

where $$[b_3 b_2 b_1 b_0] M_{\alpha\beta} = [c_3 c_2 c_1 c_0]$$

EXAMPLE 13

Mapping the RS symbols of $C_{B.3}$ in this example in $GF(2^4)$ defined by $F_B(x)$ onto symbols in $GF(2^4)$ defined by $F_G(x)$ results in codeword $C_G$. Codeword $C_G$ is the outcome of the fourth and last transformation in the following tabulation of successive transformations for mapping codeword $C_B$ in Example 10 to $C_G$.

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $C_B$   | 7  | 0 | 0  | 0  | 0 | 0 | 0 | 0  | 0 | 7 | A | C  | 6  | C  | A  |
| $C_{B.1}$ | 0  | * | *  | *  | * | * | * | *  | * | * | 0 | 4  | 2  | 11 | 2  | 4 |
| $C_{B.2}$ | 14 | * | *  | *  | * | * | * | *  | * | * | 5 | 8  | 5  | 13 | 3  | 4 |
| $C_{B.3}$ | *  | 3 | *  | 13 | * | 5 | * | 8  | * | 5 | * | *  | 14 | *  | 4  |
| $C_G$   | *  | 6 | *  | 1  | * | 5 | * | 11 | * | 5 | * | *  | 8  | *  | 13 |

The codeword polynomial $C_G(x)$ contains $g_1(x)$ as a factor.

$$C_G(x)=(\beta^6 x^7+\beta x^6+\beta^9 x^5+\beta^8 x^4+\beta x^3+\beta^2+\beta^{10}x+\beta^7)g_1(x)$$

over $GF(2^4)$ defined by $F_G(x)$.

The following are two examples of the results of a succession of transformations which map a given codeword in $C_B$ onto one in $C_G$. These represent typical test cases for testing the overall transformation because of the known structure of $C_B$ or $C_G$.

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $C_B$   | D  | D  | D | D | D  | D  | D  | D  | D | D | D  | D | D  | D  | D |
| $C_{B.1}$ | 3  | 3  | 3 | 3 | 3  | 3  | 3  | 3  | 3 | 3 | 3  | 3 | 3  | 3  | 3 |
| $C_{B.2}$ | 2  | 1  | 0 | 14 | 13 | 12 | 11 | 10 | 9 | 8 | 7  | 6 | 5  | 4  | 3 |
| $C_{B.3}$ | 11 | 4  | 12 | 5 | 13 | 6  | 14 | 7  | 0 | 8 | 1  | 9 | 2  | 10 | 3 |
| $C_G$   | 2  | 13 | 9 | 5 | 1  | 12 | 8  | 4  | 0 | 11| 7  | 3 | 14 | 10 | 6 |

The 15 symbols of $C_G$ above (expressed as i of $\beta^i$) are distinct.

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $C_B$   | A | A | D | 0 | 0 | 0 | 0 | 3  | 9 | 3  | 0  | 0 | 0  | 0  | D |
| $C_{B.1}$ | 4 | 4 | 3 | * | * | * | * | 5  | 1 | 5  | *  | * | *  | *  | 3 |
| $C_{B.2}$ | 3 | 2 | 0 | * | * | * | * | 12 | 7 | 10 | *  | * | *  | *  | 3 |
| $C_{B.3}$ | * | * | * | * | * | * | * | *  | 0 | 10 | 2  | 7 | 3  | 12 | 3 |
| $C_G$   | * | * | * | * | * | * | * | *  | 0 | 10 | 14 | 4 | 6  | 9  | 6 |

The codeword polynomial $C_G(x)$ with coefficients $C_G$ above is $g_1(x)$, a codeword polynomial (of lowest degree).

Given two codewords in any $(N,K)$ RS code. Every linear combination of the codewords is a codeword. For each of the four transformations discussed in connection with (15,9) RS codes, the transformation of the linear combination of two codewords is equal to the "sum" of the transformations on the two codewords. This is illustrated for the overall transformation of codewords $C_B$ in Code B.1 to codewords $C_G$ with intermediate results omitted.

EXAMPLE 14

Codeword $C_B^3$ (below) is a linear combination of codewords $C_B^1$ and $C_B^2$. Codewords $C_G^3$, $C_G^1$ and $C_G^2$ are the result of four successive transformations on $C_B^3$, $C_B^1$ and $C_B^2$ respectively.

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $C_B^1$ | 7 | 0  | 0 | 0 | 0  | 0 | 0  | 0  | 0 | 7  | A  | C | 6 | C | A  |
| $C_B^2$ | 0 | 7  | 0 | 0 | 0  | 0 | 0  | 0  | 0 | A  | F  | 5 | B | 9 | 4  |
| $C_B^3$ | 7 | 7  | 0 | 0 | 0  | 0 | 0  | 0  | 0 | D  | 5  | 9 | 5 | E |    |
| $C_G^1$ | * | 6  | * | 1 | *  | 5 | *  | 11 | * | 5  | *  | * | 8 | * | 13 |
| $C_G^2$ | * | 14 | * | 2 | *  | 7 | *  | 10 | * | 3  | 1  | * | * | * | 10 |
| $C_G^3$ | * | 8  | * | 5 | *  | 13| *  | 14 | * | 11 | 1  | * | 8 | * | 9  |

Refer to Example 5 where RS symbols in $GF(2^4)$ defined by $F_G(x)$ are tabulated to verify that the symbol-by-symbol "addition" of $C_G^1$ and $C_G^2$ gives $C_G^3$.

A received word $R_B$ which may contain erroneous symbols may be viewed as a symbol-by-symbol "sum" of $C_B$ with a symbol error pattern or sequence.

$$R_k = C_k + E_k \text{ for } k=0, 1, \ldots, 14$$

where $R_k = C_k$ if and only if $E_k$ is an all 0's symbol.

Note that $E_k$ is not to be confused with E, an integer which denotes the maximum number of erroneous RS symbols that are correctable. If the number of erroneous symbols is within the error correction capability $R_G$ will be corrected by the decoder designed for Code G. Clearly $R_G$ is the result of four successive transformations on the linear combination corresponding symbols comprising $C_B$ and a symbol error sequence. The decoder determines the transformed error sequence and "subtracts" it from $R_G$ to determine $C_G$. The inverses of the successive transformations (which were applied to $R_B$ to determine $R_G$) are successively applied to $C_G$ in reverse order to recover $C_B$. Clearly $R_B(x)$, intermediate word polynomials and $R_G(x)$ will not be divisible by their respective generator polynomials.

The inverses of transformations in order of their application on codewords $C_G$ are summarized as follows:

1). Field element conversion inverse.

$$\beta^{7i} \to \alpha^i \text{ or } (\beta^7)^{13i} = \beta^i \to \alpha^{13i}$$

Coefficients of codeword polynomials $C_G(x)$ in $GF(2^4)$ defined by $F_G(x)$ are mapped into corresponding coefficients of codeword polynomials $C_{B.3}(x)$ in $GF(2^4)$ defined by $F_B(x)$. See TABLE III. This is achieved by table look-up or employing the linear transformation matrix (as discussed in the section on "Mathematical Characterization of RS Symbols.")

$$M_{\beta\alpha} = \begin{bmatrix} 0 & 1 & 0 & 1 \\ 1 & 1 & 0 & 1 \\ 0 & 1 & 1 & 0 \\ 0 & 0 & 0 & 1 \end{bmatrix}$$

where $$[c_3 c_2 c_1 c_0] M_{\beta\alpha} = [b_3 b_2 b_1 b_0]$$

and $M_{\beta\alpha}$ is the inverse of $M_{\alpha\beta}$ associated with field element conversion.

2). Permutation Inverse

A primitive element change from $\alpha^{13}$ (resulting from field element conversion inverse $\beta \to \alpha^{13}$) to $\alpha^4$ is required. The solution to $$(\alpha^w)^{13} = \alpha^4 \text{ or } 13w \equiv 4 \bmod 15$$

is $w=13$ the inverse of $y=7$ in Equation (32). The respective generator polynomials for Codes G, B.3, B.2, B.1 and B are fixed. In the reverse applications of inverse transformations, codeword polynomials $C_{B.2}(x)$ must contain all the roots of $g_{2.2}(x)$ in order to contain $g_{2.2}(x)$ as a factor. Thus $$C_{B.2}(\alpha^{4j}) = C_{B.2}[(\alpha^{13})^{13j}] = 0 \text{ for } j=1, 2, \ldots, 6$$

and $C_{B.2}(x)$ is derived from $C_{B.3}(x)$ by the following permutation of the coefficients of $C_{B.3}(x)$.

$$C_{[B.3]k} \to C_{[B.3]7k} = C_{[B.2]k} \text{ for } k=0, 1, \ldots, 14$$

where 7 k is reduced modulo 15. The foregoing arguments follow those that resulted in expressions (34), (35) and (36). The permutation 13 k in (36) subsequently followed by its inverse $$k \to 13k \to 13(7)k \bmod 15 = k$$

returns the symbols of $C_{B.2}$ (i.e., symbols of $R_{B.2}$ corrected) to their original position.

3). Translation of the Powers of Roots (of $g_{2.2}$ (x)) Inverse

Of interest is the effect of the inverse translation of the powers of roots of $g_{2.2}(x)$. Given $$g_{2.2}(x) = \prod_{j=1}^{6} (x - \gamma^j) = \prod_{j=5}^{10} (x - \gamma^{j-4})$$

where $\gamma^{-4} = \gamma^{11}$ $$g_{2.2}(\gamma^{11}x) = \prod_{j=5}^{10} (\gamma^{11}x - \gamma^{11}\gamma^j)$$
$$= \gamma^6 \prod_{j=5}^{10} (x - \gamma^j) \text{ where } (\gamma^{11})^6 = \gamma^{66} \equiv 6 \bmod 15$$

Thus $$\gamma^{-6} g_{2.2}(\alpha^{14}x) = \prod_{j=5}^{10} (x - \alpha^{4j}) = g_{2.1}(x)$$

where $\gamma^{11} = (\alpha^4)^{11} = \alpha^{14}$ and $C_{B.2}(\alpha^{14}x)$ is a Code B.1 codeword polynomial.

4). Conversion from $\{\alpha^i\}$ Basis to $\{1_j\}$ Basis

See TABLE IV. This can be done by table look-up or by using the linear transformation matrix $$T_{\alpha l} = \begin{bmatrix} 1 & 1 & 0 & 1 \\ 1 & 1 & 0 & 0 \\ 1 & 0 & 0 & 1 \\ 0 & 1 & 1 & 1 \end{bmatrix}$$

where $$[b_3 b_2 b_1 b_0] T_{\alpha l} = [v_0 v_1 v_2 v_3]$$

$T_{\alpha l}$ is the inverse of $$T_{l\alpha} = \begin{bmatrix} 1 & 1 & 1 & 0 \\ 1 & 0 & 1 & 0 \\ 0 & 1 & 1 & 1 \\ 1 & 1 & 0 & 0 \end{bmatrix}$$

where $$[v_0 v_1 v_2 v_3] T_{l\alpha} = [b_3 b_2 b_1 b_0]$$

EXAMPLE 15

$R_B$ is a received word originating from Code B with erroneous symbols. Successive transformations are applied to obtain $R_G$. $R_G$ is decoded whereby erroneous symbols are corrected to determine $C_G$ a valid codeword in Code G. Successive inverse transformations are then applied to $C_G$ to recover $C_B$, the codeword in Code B most likely to have been sent.

Symbols $R_{14}$, $R_5$ and $R_2$ in word $R_B$ are in error. Since three erroneous symbols are within the symbol error-correcting capability (i.e., $2E=15-9$ and $E=3$), they are corrected when $R_G$ is decoded into $C_G$. Italicized entries in the following table are symbol changes resulting from the decoding process.

| k of $C_k$ | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| $R_B$ | D | 3 | F | 6 | 9 | D | 2 | E | 5 | 7 | 2 | C | 9 | 2 | F |
| $R_{B.1}$ | 3 | 5 | 6 | 11 | 1 | 3 | 7 | 12 | 13 | 0 | 7 | 2 | 1 | 7 | 6 |
| $R_{B.2}$ | 2 | 3 | 3 | 7 | 11 | 12 | 0 | 4 | 4 | 5 | 11 | 5 | 3 | 8 | 6 |
| $R_{B.3}$ | 0 | 8 | 12 | 3 | 11 | 5 | 7 | 11 | 3 | 5 | 3 | 4 | 2 | 4 | 6 |

| -continued | | | | | | | | | | | | | |
|---|---|---|---|---|---|---|---|---|---|---|---|---|---|
| $R_G$ | 0 | 11 | 9 | 6 | 2 | 5 | 4 | 2 | 6 | 5 | 6 | 13 | 14 | 13 | 12 |
| $C_G$ | 0 | 11 | 9 | 2 | 2 | 5 | 4 | 2 | 6 | 13 | 6 | 13 | 6 | 13 | 12 |
| $C_{B.3}$ | 0 | 8 | 12 | 11 | 11 | 5 | 7 | 11 | 3 | 4 | 3 | 4 | 3 | 4 | 6 |
| $C_{B.2}$ | 3 | 3 | 3 | 7 | 11 | 12 | 0 | 4 | 4 | 4 | 11 | 5 | 11 | 8 | 6 |
| $C_{B.1}$ | 4 | 5 | 6 | 11 | 1 | 3 | 7 | 12 | 13 | 14 | 7 | 2 | 9 | 7 | 6 |
| $C_B$ | A | 3 | F | 6 | 9 | D | 2 | E | 5 | 1 | 2 | C | B | 2 | F |

The Transformational Equivalence of Berlekamp and Conventional RS Codes for (N,K)=(255,223)

A hardware ground decoder has been designed and built and is operating to decode a (255,223) RS code. The code is associated with a conventional encoder aboard the in-flight interplanetary Galileo and Voyager spacecraft. All future interplanetary space probes, starting with Mars Observer, that utilize RS encoding must use the Berlekamp representation detailed in "Telemetry Channel Coding" Recommendation, CCSDS 101.0-B-2 Blue Book, Consultive Committee for Space Data Systems, January 1987. A succession of transformations and their inverses have been developed, programmed and incorporated into the system hardware. Words originating from Code B are mapped (by means of successive transformations) onto words in Code G, and decoded for symbol error correction. If the number of erroneous symbols are within the error correction capability of the code, the decoded word is a codeword in Code G. It is then mapped (by means of successive inverse transformations applied in reverse order) onto the codeword in Code B most likely to have been transmitted. The parameters of the codes are J=8 and E=16.

Figure 4A:
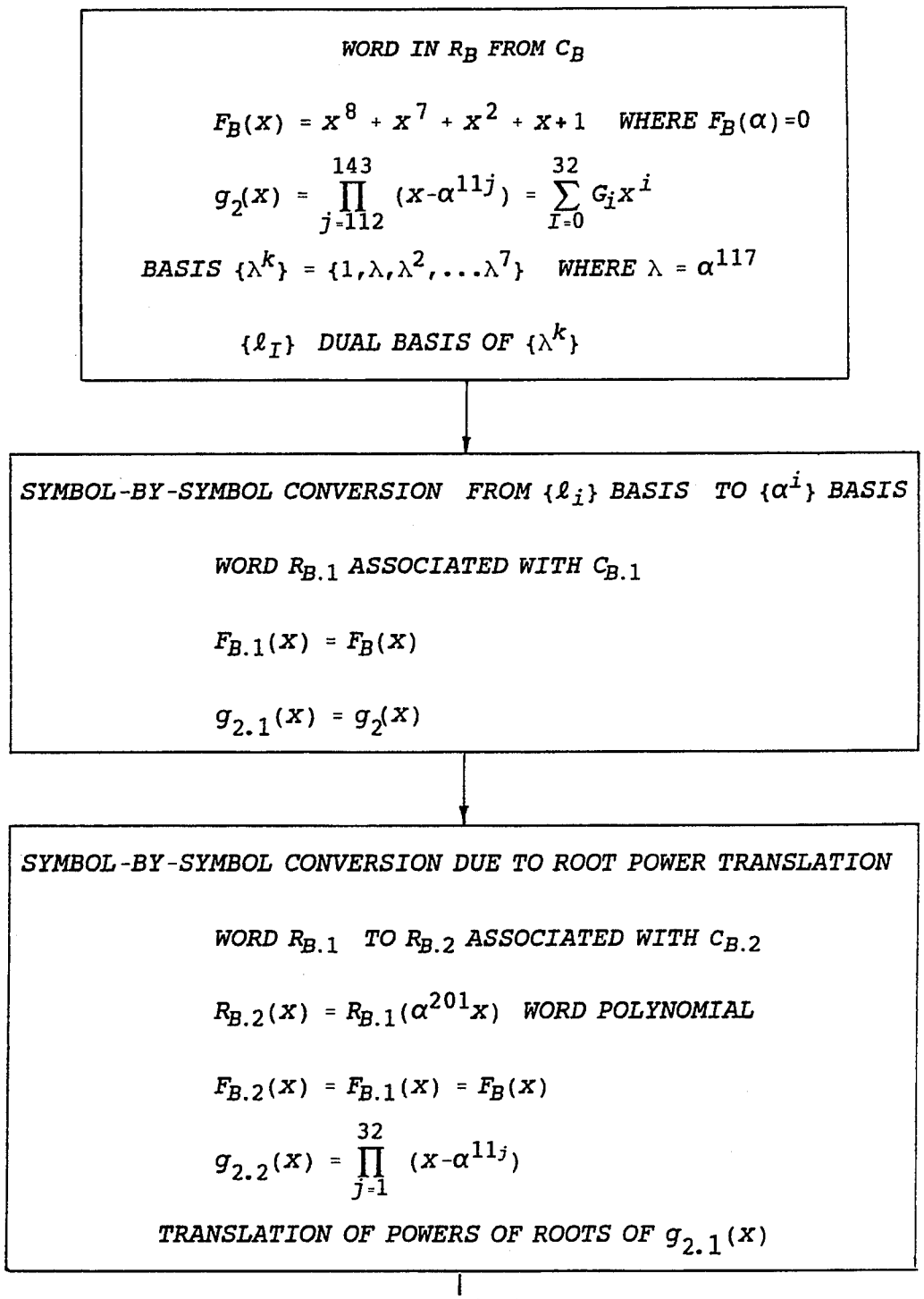

FIGS. 4a, b, c and d illustrate a flow chart of the process for transforming words $R_B$ with possible errors in a Berlekamp code to words $R_G$ in a conventional code for decoding the words $R_G$ having possible errors to codewords $C_G$ free of error. That is accomplished in blocks 100, 110, 120, 130, 140 and 150 in FIGS. 4a and b. The corrected codewords $C_G$ are then reverse transformed symbol-by-symbol back into codewords $C_B$ in the Berlekamp code. The uncorrected words in the Berlekamp code and the conventional code are here denoted by the letter R with subscripts B and G, respectively, because they are with possible error. Until corrected in block 150, FIG. 4b, they are not denoted codewords by the letter C with first the subscript G and later in the process the subscript B. The codewords $C_G$ are not information, because in the process of transformation from $R_B$ to $R_G$ for decoding (i.e., correcting errors) they have undergone permutation. To retrieve the information, the codewords $C_G$ must be transformed back into codewords $C_B$ by inverse transformation in a reverse order of process steps, as will be illustrated by the following examples.

A mathematical description of each of the (255,223) RS codes is presented as follows:

1. Code B (Parameters defined in block 100)
Field Generator Polynomial $$F_B(x) = x^8 + x^7 + x^2 + x + 1 \text{ defines } GF(2^8) \quad (37)$$

where $\alpha^8 = \alpha^7 + \alpha^2 + \alpha + 1$

Code Generator Polynomial $$g_2(x) = \prod_{j=112}^{143}(x - \alpha^{11j}) = \sum_{i=0}^{32} G_i x^i \quad (38)$$

Basis $\{\lambda^k\}$ $$\{1, \lambda, \lambda^2, \ldots, \lambda^7\} \text{ where } \lambda = \alpha^{117} \quad (39)$$

$\{l_j\}$ Dual Basis of $\{\lambda^k\}$ $$\{l_0, l_1, \ldots, l_7\} = \quad (40)$$

$$\{\alpha^{125}, \alpha^{88}, \alpha^{226}, \alpha^{163}, \alpha^{46}, \alpha^{184}, \alpha^{67}, \alpha^{242}\}$$

Elements in $GF(2^8)$ defined by $F_B(x)$ in Equation (37) represented in basis $\{\alpha^i\}$ and basis $\{l_j\}$ appear in TABLE V.

TABLE V

Elements of $GF(2^8)$ Defined by $F_B(x) = x^8 + x^7 + x^2 + x + 1$ in Basis $\{\alpha^i\}$ and Basis $\{l_j\}$.

| i of $\alpha^i$ | i of $b_i$ | Tr($\alpha^i$) | j of $v_j$ |
|---|---|---|---|
| | 76543210 | | 01234567 |
| * | 00000000 | 0 | 00000000 |
| 0 | 00000001 | 0 | 01111011 |
| 1 | 00000010 | 1 | 10101111 |
| 2 | 00000100 | 1 | 10011001 |
| 3 | 00001000 | 1 | 11111010 |
| 4 | 00010000 | 1 | 10000110 |
| 5 | 00100000 | 1 | 11101100 |
| 6 | 01000000 | 1 | 11101111 |
| 7 | 10000000 | 1 | 10001101 |
| 8 | 10000111 | 1 | 11000000 |
| 9 | 10001001 | 0 | 00001100 |
| 10 | 10010101 | 1 | 11101001 |
| 11 | 10101101 | 0 | 01111001 |
| 12 | 11011101 | 1 | 11111100 |
| 13 | 00111101 | 0 | 01110010 |
| 14 | 01111010 | 1 | 11010000 |
| 15 | 11110100 | 1 | 10010001 |
| 16 | 01101111 | 1 | 10110100 |
| 17 | 11011110 | 0 | 00101000 |
| 18 | 00111011 | 0 | 01000100 |
| 19 | 01110110 | 1 | 10110011 |
| 20 | 11101100 | 1 | 11101101 |
| 21 | 01011111 | 1 | 11011110 |
| 22 | 10111110 | 0 | 00101011 |
| 23 | 11111011 | 0 | 00100110 |
| 24 | 01110001 | 1 | 11111110 |
| 25 | 11100010 | 0 | 00100001 |
| 26 | 01000011 | 0 | 00111011 |
| 27 | 10000110 | 1 | 10111011 |
| 28 | 10001011 | 1 | 10100011 |
| 29 | 10010001 | 0 | 01110000 |
| 30 | 10100101 | 1 | 10000011 |
| 31 | 11001101 | 0 | 01111010 |
| 32 | 00011101 | 1 | 10011110 |
| 33 | 00111010 | 0 | 00111111 |
| 34 | 01110100 | 0 | 00011100 |
| 35 | 11101000 | 0 | 01110100 |
| 36 | 01010111 | 0 | 00100100 |
| 37 | 10101110 | 1 | 10101101 |
| 38 | 11011011 | 1 | 11001010 |
| 39 | 00110001 | 0 | 00010001 |
| 40 | 01100010 | 1 | 10101100 |
| 41 | 11000100 | 1 | 11111011 |
| 42 | 00001111 | 1 | 10110111 |
| 43 | 00011110 | 0 | 01001010 |
| 44 | 00111100 | 0 | 00001001 |
| 45 | 01111000 | 0 | 01111111 |
| 46 | 11110000 | 0 | 00001000(l4) |
| 47 | 01100111 | 0 | 01001110 |
| 48 | 11001110 | 1 | 10101110 |
| 49 | 00011011 | 1 | 10101000 |
| 50 | 00110110 | 0 | 01011100 |
| 51 | 01101100 | 0 | 01100000 |
| 52 | 11011000 | 0 | 00011110 |

TABLE V-continued

Elements of $GF(2^8)$ Defined by $F_B(x) = x^8 + x^7 + x^2 + x + 1$ in Basis $\{\alpha^i\}$ and Basis $\{l_j\}$.

| i of $\alpha^i$ | i of $b_i$ | $Tr(\alpha^i)$ | j of $v_j$ |
|---|---|---|---|
| 53 | 00110111 | 0 | 00100111 |
| 54 | 01101110 | 1 | 11001111 |
| 55 | 11011100 | 1 | 10000111 |
| 56 | 00111111 | 1 | 11011101 |
| 57 | 01111110 | 0 | 01001001 |
| 58 | 11111100 | 0 | 01101011 |
| 59 | 01111111 | 0 | 00110010 |
| 60 | 11111110 | 1 | 11000100 |
| 61 | 01111011 | 1 | 10101011 |
| 62 | 11110110 | 0 | 00111110 |
| 63 | 01101011 | 0 | 00101101 |
| 64 | 11010110 | 1 | 11010010 |
| 65 | 00101011 | 1 | 11000010 |
| 66 | 01010110 | 0 | 01011111 |
| 67 | 10101100 | 0 | 00000010($l_6$) |
| 68 | 11011111 | 0 | 01010011 |
| 69 | 00111001 | 1 | 11101011 |
| 70 | 01110010 | 0 | 00101010 |
| 71 | 11100100 | 0 | 00010111 |
| 72 | 01001111 | 0 | 01011000 |
| 73 | 10011110 | 1 | 11000111 |
| 74 | 10111011 | 1 | 11001001 |
| 75 | 11110001 | 0 | 01110011 |
| 76 | 01100101 | 1 | 11100001 |
| 77 | 11001010 | 0 | 00110111 |
| 78 | 00010011 | 0 | 01010010 |
| 79 | 00100110 | 1 | 11011010 |
| 80 | 01001100 | 1 | 10001100 |
| 81 | 10011000 | 1 | 11110001 |
| 82 | 10110111 | 1 | 10101010 |
| 83 | 11101001 | 0 | 00001111 |
| 84 | 01010101 | 1 | 10001011 |
| 85 | 10101010 | 0 | 00110100 |
| 86 | 11010011 | 0 | 00110000 |
| 87 | 00100001 | 1 | 10010111 |
| 88 | 01000010 | 0 | 01000000($l_1$) |
| 89 | 10000100 | 0 | 00010100 |
| 90 | 10001111 | 0 | 00111010 |
| 91 | 10011001 | 1 | 10001010 |
| 92 | 10110101 | 0 | 00000101 |
| 93 | 11101101 | 1 | 10010110 |
| 94 | 01011101 | 0 | 01110001 |
| 95 | 10111010 | 1 | 10110010 |
| 96 | 11110011 | 1 | 11011100 |
| 97 | 01100001 | 0 | 01111000 |
| 98 | 11000010 | 1 | 11001101 |
| 99 | 00000011 | 1 | 11010100 |
| 100 | 00000110 | 0 | 00110110 |
| 101 | 00001100 | 0 | 01100011 |
| 102 | 00011000 | 0 | 01111100 |
| 103 | 00110000 | 0 | 01101010 |
| 104 | 01100000 | 0 | 00000011 |
| 105 | 11000000 | 0 | 01100010 |
| 106 | 00000111 | 0 | 01001101 |
| 107 | 00001110 | 1 | 11001100 |
| 108 | 00011100 | 1 | 11100101 |
| 109 | 00111000 | 1 | 10010000 |
| 110 | 01110000 | 1 | 10000101 |
| 111 | 11100000 | 1 | 10001110 |
| 112 | 01000111 | 1 | 10100010 |
| 113 | 10001110 | 0 | 01000001 |
| 114 | 10011011 | 0 | 00100101 |
| 115 | 10110001 | 1 | 10011100 |
| 116 | 11100101 | 0 | 01101100 |
| 117 | 01001101 | 1 | 11110111 |
| 118 | 1011010 | 0 | 01011110 |
| 119 | 10110011 | 0 | 00110011 |
| 120 | 11100001 | 1 | 11110101 |
| 121 | 01000101 | 0 | 00001101 |
| 122 | 10001010 | 1 | 11011000 |
| 123 | 10010011 | 1 | 11011111 |
| 124 | 10100001 | 0 | 00011010 |
| 125 | 11000101 | 1 | 10000000($l_0$) |
| 126 | 00001101 | 0 | 01001000 |
| 127 | 00011010 | 1 | 11010011 |
| 128 | 00110100 | 1 | 11110011 |
| 129 | 01101000 | 1 | 11111001 |
| 130 | 11010000 | 1 | 11100100 |
| 131 | 00100111 | 1 | 10100001 |
| 132 | 01001110 | 0 | 00100011 |
| 133 | 10011100 | 0 | 01101000 |
| 134 | 10111111 | 0 | 01010000 |
| 135 | 11111001 | 1 | 10001001 |
| 136 | 01110101 | 0 | 01100111 |
| 137 | 11101010 | 1 | 11011011 |
| 138 | 01010011 | 1 | 10111101 |
| 139 | 10100110 | 1 | 01010111 |
| 140 | 11001011 | 0 | 01001100 |
| 141 | 00010001 | 1 | 11111101 |
| 142 | 00100010 | 0 | 01000011 |
| 143 | 01000100 | 0 | 01110110 |
| 144 | 10001000 | 0 | 01110111 |
| 145 | 10010111 | 0 | 01000110 |
| 146 | 10101001 | 1 | 11100000 |
| 147 | 11010101 | 0 | 00000011 |
| 148 | 00101101 | 1 | 11110100 |
| 149 | 01011010 | 0 | 00111100 |
| 150 | 10110100 | 0 | 01111110 |
| 151 | 11101111 | 0 | 00111001 |
| 152 | 01011001 | 1 | 11101000 |
| 153 | 10110010 | 0 | 01001000 |
| 154 | 11100011 | 0 | 01011010 |
| 155 | 01000001 | 1 | 10010100 |
| 156 | 10000010 | 0 | 00100010 |
| 157 | 10000011 | 0 | 01011001 |
| 158 | 10000001 | 1 | 11110110 |
| 159 | 10000101 | 0 | 01101111 |
| 160 | 10001101 | 1 | 10010101 |
| 161 | 10011101 | 0 | 00010011 |
| 162 | 10111101 | 1 | 11111111 |
| 163 | 11111101 | 0 | 00010000($l_3$) |
| 164 | 01111101 | 1 | 10011101 |
| 165 | 11111010 | 0 | 01011101 |
| 166 | 01110011 | 0 | 01010001 |
| 167 | 11100110 | 1 | 10111000 |
| 168 | 01001011 | 1 | 11000001 |
| 169 | 10010110 | 0 | 00111101 |
| 170 | 10101011 | 0 | 01001111 |
| 171 | 11010001 | 1 | 10011111 |
| 172 | 00100101 | 0 | 00001110 |
| 173 | 01001010 | 1 | 10111010 |
| 174 | 10010100 | 1 | 10010010 |
| 175 | 10101111 | 1 | 11010110 |
| 176 | 11011001 | 0 | 01100101 |
| 177 | 00110101 | 1 | 10001000 |
| 178 | 01101010 | 0 | 01010110 |
| 179 | 11010100 | 0 | 01111101 |
| 180 | 00101111 | 0 | 01011011 |
| 181 | 01011110 | 1 | 10100101 |
| 182 | 10111100 | 1 | 10000100 |
| 183 | iiiiiiii | 1 | 10111111 |
| 184 | 01111001 | 0 | 00000100($l_5$) |
| 185 | 11110010 | 1 | 10100111 |
| 186 | 01100011 | 1 | 11010111 |
| 187 | 11000110 | 0 | 01010100 |
| 188 | 00001011 | 0 | 00101110 |
| 189 | 00010110 | 1 | 10110000 |
| 190 | 00101100 | 1 | 10001111 |
| 191 | 01011000 | 1 | 10010011 |
| 192 | 10110000 | 1 | 11100111 |
| 193 | 11100111 | 1 | 11000011 |
| 194 | 01001001 | 0 | 01101110 |
| 195 | 10010010 | 1 | 10100100 |
| 196 | 10100011 | 1 | 10110101 |
| 197 | 11000001 | 0 | 00011001 |
| 198 | 00000101 | 1 | 11100010 |
| 199 | 00001010 | 0 | 01010101 |
| 200 | 00010100 | 0 | 00011111 |
| 201 | 00101000 | 0 | 00010110 |
| 202 | 01010000 | 0 | 01101001 |
| 203 | 10100000 | 0 | 01100001 |
| 204 | 11000111 | 0 | 00101111 |
| 205 | 00001001 | 1 | 10000001 |
| 206 | 00010010 | 0 | 00101001 |
| 207 | 00100100 | 0 | 01110101 |
| 208 | 01001000 | 0 | 00010101 |

TABLE V-continued

Elements of GF($2^8$) Defined by $F_B(x) = x^8 + x^7 + x^2 + x + 1$ in Basis $\{\alpha^i\}$ and Basis $\{l_j\}$.

| i of $\alpha^i$ | i of $b_i$ | Tr($\alpha^i$) | j of $v_j$ |
|---|---|---|---|
| 209 | 10010000 | 0 | 00001011 |
| 210 | 10100111 | 0 | 00101100 |
| 211 | 11001001 | 1 | 11100011 |
| 212 | 00010101 | 0 | 01010100 |
| 213 | 00101010 | 1 | 10111001 |
| 214 | 01010100 | 1 | 11110000 |
| 215 | 10101000 | 1 | 10011011 |
| 216 | 11010111 | 1 | 10101001 |
| 217 | 00101001 | 0 | 01101101 |
| 218 | 01010010 | 1 | 11000110 |
| 219 | 10100100 | 1 | 11111000 |
| 220 | 11001111 | 1 | 11010101 |
| 221 | 00011001 | 0 | 00000111 |
| 222 | 00110010 | 1 | 11000101 |
| 223 | 01100100 | 1 | 10011010 |
| 224 | 11001000 | 1 | 10011000 |
| 225 | 00010111 | 1 | 11001011 |
| 226 | 00101110 | 0 | 00100000($l_2$) |
| 227 | 01011100 | 0 | 00001010 |
| 228 | 10111000 | 0 | 00011101 |
| 2~9 | 11110111 | 0 | 01000101 |
| 230 | 01101001 | 1 | 10000010 |
| 231 | 11010010 | 0 | 01001011 |
| 232 | 00100011 | 0 | 00111000 |
| 233 | 01000110 | 1 | 11011001 |
| 234 | 10001100 | 1 | 11101110 |
| 235 | 10011111 | 1 | 10111100 |
| 236 | 10111001 | 0 | 01100110 |
| 237 | 11110101 | 1 | 11101010 |
| 238 | 01101101 | 0 | 00011011 |
| 239 | 11011010 | 1 | 10110001 |
| 240 | 00110011 | 1 | 10111110 |
| 241 | 01100110 | 0 | 00110101 |
| 242 | 11001100 | 0 | 00000001($l_7$) |
| 243 | 00011111 | 0 | 00110001 |
| 244 | 00111110 | 1 | 10100110 |
| 245 | 01111100 | 1 | 11100110 |
| 246 | 11111000 | 1 | 11110010 |
| 247 | 01110111 | 1 | 11001000 |
| 248 | 11101110 | 0 | 01000010 |
| 249 | 01011011 | 0 | 01000111 |
| 250 | 10110110 | 1 | 11010001 |
| 251 | 11101011 | 1 | 10100000 |
| 252 | 01010001 | 0 | 00010010 |
| 253 | 10100010 | 1 | 11001110 |
| 254 | 11000011 | 1 | 10110110 |

The coefficients ($G_{32}, G_{31}, \ldots, G_0$) of $g_2(x)$ in Equation (38), the self-reciprocal generator polynomial over GF($2^8$) of Code B are

| $G_{32} \rightarrow$ | 0 | 249 | 59 | 66 | 4 | 43 | 126 | 251 | 97 | 30 | 3 |
|---|---|---|---|---|---|---|---|---|---|---|---|
| | 213 | 50 | 66 | 170 | 5 | 24 | 5 | 170 | 66 | 50 | 213 |
| | 3 | 30 | 97 | 251 | 126 | 43 | 4 | 66 | 59 | 249 | 0 $\leftarrow G_0$ | expressed as i of $\alpha^i$ in TABLE V. Note that are 15 distinct nonzero entries and $G_i = G_{32-i}$ and $G_3 = G_{29} = G_{13} = G_{19} = 66$ (i.e., $\alpha^{66}$)

Figure 2:
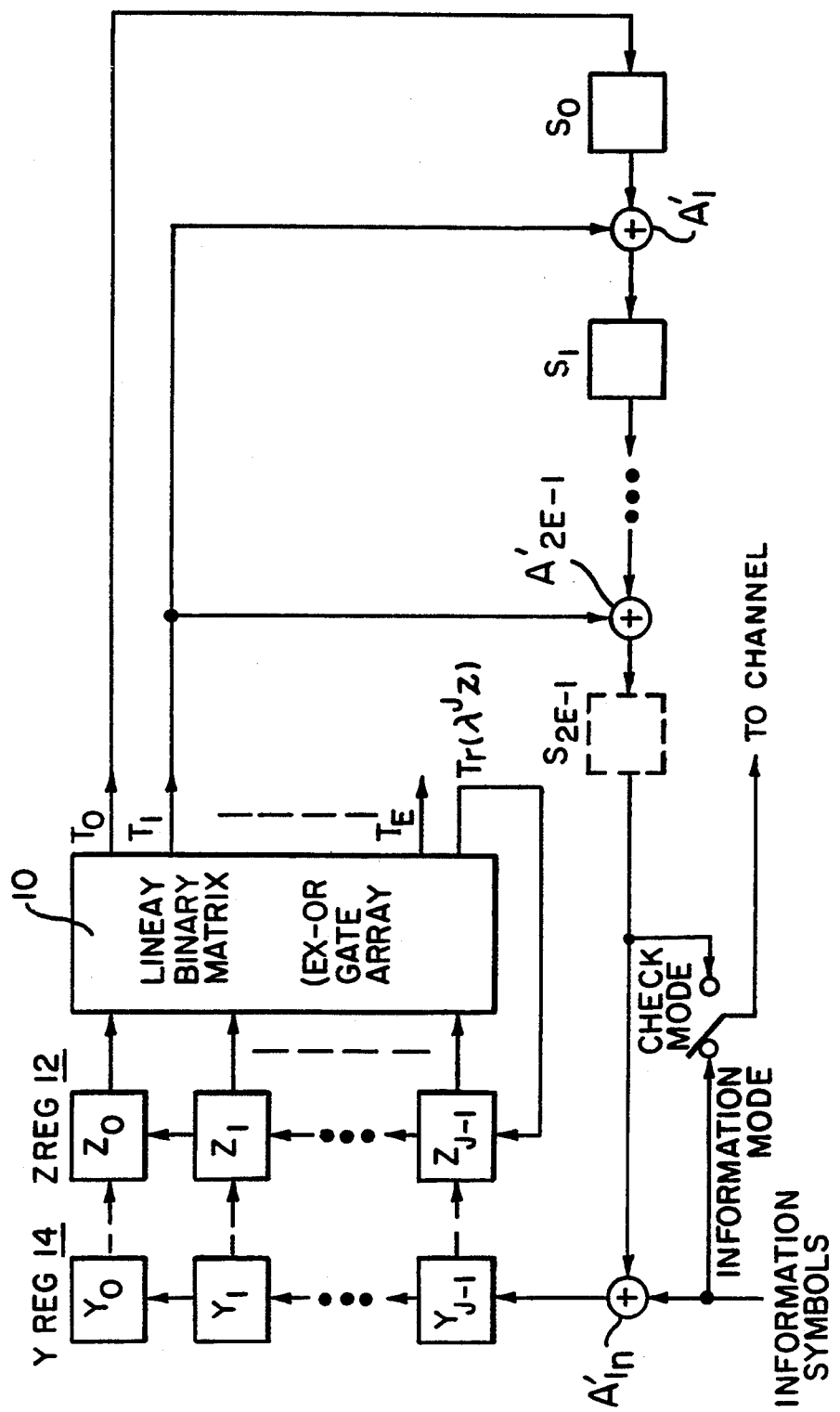
FIG. 2 illustrates an (N,K) RS endecoder utilizing Berlekamp's architecture.

(The $\{T_l\}$ linear functions of $z_i$ components for designing the linear binary matrix in FIG. 2 can be found in Ref. [3]).

2. Code G $F_G(x) = x^8 + x^4 + x^3 + x^2 + 1$ defines GF($2^8$)

where $\beta^8 = \beta^4 + \beta^3 + \beta^2 + 1$

Code Generator Polynomial $$g_1(x) = \prod_{j=1}^{32}(x - \beta^j) = \sum_{i=0}^{32} G_i x^i \quad (41)$$

Elements in GF($2^8$) defined by $F_G(x)$ in (41) are given in TABLE VI. The coefficients ($G_{32}, G_{31}, \ldots, G_0$) of $g_1(x)$ in (41), the generator polynomial over GF($2^8$) of Code G are

| $G_{32} \rightarrow$ | 0 | 11 | 8 | 109 | 194 | 254 | 173 | 11 | 75 | 218 | 148 |
|---|---|---|---|---|---|---|---|---|---|---|---|
| | 149 | 44 | 0 | 137 | 104 | 43 | 137 | 203 | 99 | 176 | 59 |
| | 91 | 194 | 84 | 53 | 248 | 107 | 80 | 28 | 215 | 251 | 18 $\leftarrow G_0$ | expressed as i of $\beta^i$ in TABLE VI. Note that there 28 distinct nonzero entries corresponding to 28 different multipliers.

Transformations between Berlekamp and Galileo (Voyager) (255,223) RS codes are summarized as follows:

1). Conversion from $\{l_j\}$ Basis and $\{\alpha^i\}$ Basis (Block 110) and its Inverse (Block 190).

Refer to TABLE V. Symbol-by-symbol conversion may be provided by table look-up. Also post-multiplication on the 8-bit binary vector representation of a symbol by the linear transformation matrix $T_{l\alpha}$ realizes the conversion. The transformation matrix and its inverse is derived from TABLE V.

TABLE VI

Elements in GF($2^8$) Defined by $F_G(x) = x^8 + x^4 + x^3 + x^2 + 1$.

| i of $\beta^i$ | i of $c_i$ |
|---|---|
| | 76543210 |
| * | 00000000 |
| 0 | 00000001 |
| 1 | 00000010 |
| 2 | 00000100 |
| 3 | 00001000 |
| 4 | 00010000 |
| 5 | 00100000 |
| 6 | 01000000 |
| 7 | 10000000 |
| 8 | 00011101 |
| 9 | 00111010 |
| 10 | 01110100 |
| 11 | 11101000 |
| 12 | 11001101 |
| 13 | 10000111 |
| 14 | 00010011 |
| 15 | 00100110 |
| 16 | 01001100 |
| 17 | 10011000 |
| 18 | 00101101 |
| 19 | 01011010 |
| 20 | 10110100 |
| 21 | 01110101 |
| 22 | 11101010 |
| 23 | 11001001 |
| 24 | 10001111 |
| 25 | 00000011 |
| 26 | 00000110 |
| 27 | 00001100 |
| 28 | 00011000 |
| 29 | 00110000 |

TABLE VI-continued

Elements in $GF(2^8)$ Defined by
$F_G(x) = x^8 + x^4 + x^3 + x^2 + 1.$

| i of $\beta^i$ | i of $c_i$ |
|---|---|
| 30 | 01100000 |
| 31 | 11000000 |
| 32 | 10011101 |
| 33 | 00100111 |
| 34 | 01001110 |
| 35 | 10011100 |
| 36 | 00100101 |
| 37 | 01001010 |
| 38 | 10010100 |
| 39 | 00110101 |
| 40 | 01101010 |
| 41 | 11010100 |
| 42 | 10110101 |
| 43 | 01110111 |
| 44 | 11101110 |
| 45 | 11000001 |
| 46 | 10011111 |
| 47 | 00100011 |
| 48 | 01000110 |
| 49 | 10001100 |
| 50 | 00000101 |
| 51 | 00001010 |
| 52 | 00010100 |
| 53 | 00101000 |
| 54 | 01010000 |
| 55 | 10100000 |
| 56 | 01011101 |
| 57 | 10111010 |
| 58 | 01101001 |
| 59 | 11010010 |
| 60 | 10111001 |
| 61 | 01101111 |
| 62 | 11011110 |
| 63 | 10100001 |
| 64 | 01011111 |
| 65 | 10111110 |
| 66 | 01100001 |
| 67 | 11000010 |
| 68 | 10011001 |
| 69 | 00101111 |
| 70 | 01011110 |
| 71 | 10111100 |
| 72 | 01100101 |
| 73 | 11001010 |
| 74 | 10001001 |
| 75 | 00001111 |
| 76 | 00011110 |
| 77 | 00111100 |
| 78 | 01111000 |
| 79 | 11110000 |
| 80 | 11111101 |
| 81 | 11100111 |
| 82 | 11010011 |
| 83 | 10111011 |
| 84 | 01101011 |
| 85 | 11010110 |
| 86 | 10110001 |
| 87 | 01111111 |
| 88 | 11111110 |
| 89 | 11100001 |
| 90 | 11011111 |
| 91 | 10100011 |
| 92 | 01011011 |
| 93 | 10110110 |
| 94 | 01110001 |
| 95 | 11100010 |
| 96 | 11011001 |
| 97 | 10101111 |
| 98 | 01000011 |
| 99 | 10000110 |
| 100 | 00010001 |
| 101 | 00100010 |
| 102 | 01000100 |
| 103 | 10001000 |
| 104 | 00001101 |
| 105 | 00011010 |
| 106 | 00110100 |
| 107 | 01101000 |
| 108 | 11010000 |
| 109 | 10111101 |
| 110 | 01100111 |
| 111 | 11001110 |
| 112 | 10000001 |
| 113 | 00011111 |
| 114 | 00111110 |
| 115 | 01111100 |
| 116 | 11111000 |
| 117 | 11101101 |
| 118 | 11000111 |
| 119 | 10010011 |
| 120 | 00111011 |
| 121 | 01110110 |
| 122 | 11101100 |
| 123 | 11000101 |
| 124 | 10010111 |
| 125 | 00110011 |
| 126 | 01100110 |
| 127 | 11001100 |
| 128 | 10000101 |
| 129 | 00010111 |
| 130 | 00101110 |
| 131 | 01011100 |
| 132 | 10111000 |
| 133 | 01101101 |
| 134 | 11011010 |
| 135 | 10101001 |
| 136 | 01001111 |
| 137 | 10011110 |
| 138 | 00100001 |
| 139 | 01000010 |
| 140 | 10000100 |
| 141 | 00010101 |
| 142 | 00101010 |
| 143 | 01010100 |
| 144 | 10101000 |
| 145 | 01001101 |
| 146 | 10011010 |
| 147 | 00101001 |
| 148 | 01010010 |
| 149 | 10100100 |
| 150 | 01010101 |
| 151 | 10101010 |
| 152 | 01001001 |
| 153 | 10010010 |
| 154 | 00111001 |
| 155 | 01110010 |
| 156 | 11100100 |
| 157 | 11010101 |
| 158 | 10110111 |
| 159 | 01110011 |
| 160 | 11100110 |
| 161 | 11010001 |
| 162 | 10111111 |
| 163 | 01100011 |
| 164 | 11000110 |
| 165 | 10010001 |
| 166 | 00111111 |
| 167 | 01111110 |
| 168 | 11111100 |
| 169 | 11100101 |
| 170 | 11010111 |
| 171 | 10110011 |
| 172 | 01111011 |
| 173 | 11110110 |
| 174 | 11110001 |
| 175 | 11111111 |
| 176 | 11100011 |
| 177 | 11011011 |
| 178 | 10101011 |
| 179 | 01001011 |
| 180 | 10010110 |
| 181 | 00110001 |
| 182 | 01100010 |
| 183 | 11000100 |
| 184 | 10010101 |
| 185 | 00110111 |

TABLE VI-continued

Elements in GF($2^8$) Defined by
$F_G(x) = x^8 + x^4 + x^3 + x^2 + 1$.

| i of $\beta^i$ | i of $c_i$ |
|---|---|
| 186 | 01101110 |
| 187 | 11011100 |
| 188 | 10100101 |
| 189 | 01010111 |
| 190 | 10101110 |
| 191 | 01000001 |
| 192 | 10000010 |
| 193 | 00011001 |
| 194 | 00110010 |
| 195 | 01100100 |
| 196 | 11001000 |
| 197 | 10001101 |
| 198 | 00000111 |
| 199 | 00001110 |
| 200 | 00011100 |
| 201 | 00111000 |
| 202 | 01110000 |
| 203 | 11100000 |
| 204 | 11011101 |
| 205 | 10100111 |
| 206 | 01010011 |
| 207 | 10100110 |
| 208 | 01010001 |
| 209 | 10100010 |
| 210 | 01011001 |
| 211 | 10110010 |
| 212 | 01111001 |
| 213 | 11110010 |
| 214 | 11111001 |
| 215 | 11101111 |
| 216 | 11000011 |
| 217 | 10011011 |
| 218 | 00101011 |
| 219 | 01010110 |
| 220 | 10101100 |
| 221 | 01000101 |
| 222 | 10001010 |
| 223 | 00001001 |
| 224 | 00010010 |
| 225 | 00100100 |
| 226 | 01001000 |
| 227 | 10010000 |
| 228 | 00111101 |
| 229 | 01111010 |
| 230 | 11110100 |
| 231 | 11110101 |
| 232 | 11110111 |
| 233 | 11110011 |
| 234 | 11111011 |
| 235 | 11101011 |
| 236 | 11001011 |
| 237 | 10001011 |
| 238 | 00001011 |
| 239 | 00010110 |
| 240 | 00101100 |
| 241 | 01011000 |
| 242 | 10110000 |
| 243 | 01111101 |
| 244 | 11111010 |
| 245 | 11101001 |
| 246 | 11001111 |
| 247 | 10000011 |
| 248 | 00011011 |
| 249 | 00110110 |
| 250 | 01101100 |
| 251 | 11011000 |
| 252 | 10101101 |
| 253 | 01000111 |
| 254 | 10001110 |

$[v_0, v_1, \ldots, v_7]T_{la} = [b_7, b_6, \ldots, b_0]$ where $$T_{la} = \begin{bmatrix} 1 & 1 & 0 & 0 & 0 & 1 & 0 & 1 \\ 0 & 1 & 0 & 0 & 0 & 0 & 1 & 0 \\ 0 & 0 & 1 & 0 & 1 & 1 & 1 & 0 \\ 1 & 1 & 1 & 1 & 1 & 1 & 0 & 1 \\ 1 & 1 & 1 & 1 & 0 & 0 & 0 & 0 \\ 0 & 1 & 1 & 1 & 1 & 0 & 0 & 1 \\ 1 & 0 & 1 & 0 & 1 & 1 & 0 & 0 \\ 1 & 1 & 0 & 0 & 1 & 1 & 0 & 0 \end{bmatrix}$$

Table look-up can provide the inverse transformation or $[b_7, b_6, \ldots, b_0]T_{al} = [v_0, v_1, \ldots, v_7]$ where $$T_{al} = \begin{bmatrix} 1 & 0 & 0 & 0 & 1 & 1 & 0 & 1 \\ 1 & 1 & 1 & 0 & 1 & 1 & 1 & 1 \\ 1 & 1 & 1 & 0 & 1 & 1 & 0 & 0 \\ 1 & 0 & 0 & 0 & 0 & 1 & 1 & 0 \\ 1 & 1 & 1 & 1 & 1 & 0 & 1 & 0 \\ 1 & 0 & 0 & 1 & 1 & 0 & 0 & 1 \\ 1 & 0 & 1 & 0 & 1 & 1 & 1 & 1 \\ 0 & 1 & 1 & 1 & 1 & 0 & 1 & 1 \end{bmatrix}$$

2). Translation of Powers of Roots in $g_{2.1}(x)$ (Block 120) and its Inverse (Block 180).

The degree 32 generator polynomial $g_{2.1}(x) = g_2(x)$ as given in (38). Translating j running from 112 to 143 in the product summation form to run from 1 to 32 requires a change in the argument x. See Ref. [12] and the discussion in Section 5.A. (dealing with (15,9) RS codes) leading to Example 11 and subsequent expressions involving the effect of the inverse translation. Omitting the step-by-step derivation of $g_{2.2}(x)$ from $g_{2.1}(x)$ and codeword polynomial $C_{B.2}(x)$ from $C_{B.1}(x)$ the results over GF($2^8$) defined by $F_B(x)$ are $$\gamma^{-237}g_{2.1}(\alpha^{201}x) = \prod_{j=1}^{32}(x - \alpha^{11j}) = g_{2.2}(x) \quad (42)$$

where $\gamma = \alpha^{11}$ and $$C_{B.1}(\alpha^{201}x) = C_{B.2}(x) = u(x)g_{2.2}(x) \quad (43)$$

The coefficients ($G_{32}, G_{31}, \ldots, G_0$) of $g_{2.2}(x)$ in (42), the generator polynomial over GF($2^8$) of Code B.2 are

| $G_{32} \rightarrow$ | 0 | 48 | 167 | 228 | 220 | 58 | 195 | 119 | 19 | 63 | 3 |
|---|---|---|---|---|---|---|---|---|---|---|---|
| | 42 | 188 | 3 | 161 | 50 | 123 | 158 | 122 | 72 | 110 | 72 |
| | 171 | 252 | 118 | 71 | 0 | 226 | 241 | 102 | 149 | 138 | 198 $\leftarrow G_0$ | expressed as i of $\alpha^i$ in TABLE V.

Following are the results associated with the inverse translation:

$$\gamma^{-18} g_{2.2}(\alpha^{54} x) = \prod_{j=112}^{143} (x - \alpha^{11j}) = g_{2.1}(x) \quad (44)$$

The coefficients $(G_{32}, G_{31}, \ldots, G_0)$ of $g_{2.3}(x)$ in (46), the generator polynomial over $GF(2^8)$ of Code B.3 are

| $G_{32} \rightarrow$ | 0 | 148 | 154 | 122 | 37 | 172 | 79 | 148 | 105 | 244 | 44 |
|---|---|---|---|---|---|---|---|---|---|---|---|
| | 127 | 82 | 0 | 151 | 217 | 254 | 151 | 19 | 57 | 73 | 52 |
| | 158 | 37 | 87 | 64 | 184 | 211 | 10 | 29 | 250 | 178 | 219 $\leftarrow G_0$ | where $\gamma = \alpha^{11}$ and $$C_{B.2}(\alpha^{54} x) = C_{B.1}(x) = v(x) g_{2.2}(x) \quad (45)$$

3). Permutation (Block 130) and its Inverse (Block 170) which Accounts for a Primitive Element Change In preparation for converting field elements defined by $F_B(x)$ to those defined by $F_G(x)$ an isomorphism between the two representations of $GF(2^8)$ must be established. See Section 2. and Ref. [2]. It may be verified from TABLES V and VI that the one-to-one mapping $$\alpha^i \rightleftharpoons \beta^{-43i} = \beta^{212i}$$

is an isomorphism. The elements $\alpha$ and $\beta^{212}$ have the same minimal polynomial, namely, $F_B(x)$. Also $$\alpha^{83} \rightarrow (\beta^{212})^{83} = \beta \text{ since } 212 \times 83 \equiv 1 \text{ mod } 255$$

A primitive element change in (42) from $\alpha^{11}$ to $\alpha^{83}$ is needed prior to field element conversion. The unique solution to $$(\alpha^y)^{11} = \alpha^{83} \text{ or } 11y \equiv 83 \text{ mod } 255$$

is $$y = 193$$

and the inverse of y is 37 (i.e., $193 \times 37 \equiv 1$). The primitive element change in (42) corresponds to $g_{2.2}(x)$ becoming $$g_{2.3}(x) = \prod_{j=1}^{32} (x - \alpha^{83j}) \quad (46)$$

where $(\alpha^{193})^{11} = \alpha^{83}$

In order for $C_{B.3}(x)$ to contain $g_{2.3}(x)$ as a factor, the coefficients of $C_{B.3}(x)$ is a permutation of the coefficients of $C_{B.2}(x)$. That is $$C_{[B.2]k} \rightarrow C_{[B.2]37k} = C_{[B.3]k} \text{ for } k=0, 1, \ldots, 254 \quad (47)$$

Since 37 (the inverse of 193) has no common factor with 255 ($=3 \times 5 \times 17$) the permutation in (47) is guaranteed (i.e., no two coefficients will map to the same position).

Similarly the inverse permutation is associated with the change of primitive element from $$\alpha^{83} \text{ to } (\alpha^{37})^{83} = \alpha^{11}$$

The coefficients of $C_{B.2}(x)$ is the following permutation of the coefficients of $C_{B.2}(x)$ $$C_{[B.3]k} \rightarrow C_{[B.3]193k} = C_{[B.2]k} \text{ for } k=0, 1, \ldots, 254 \quad (48)$$

expressed as i of $\alpha^i$ in TABLE V.

4). Field Element Conversion (Block 140) and its Inverse (Block 160).

Coefficients of codeword polynomials $C_{B.3}(x)$ (including $g_{2.3}(x)$, a codeword polynomial of minimum degree) in $GF(2^8)$ defined by $F_B(x)$ are mapped into corresponding coefficients of codeword polynomials $C_G(x)$. The one-to-one mapping $$\alpha^i \rightarrow \beta^{212i}$$

is achievable by table look-up. The conversion can also be done by the linear matrix equation $$[b_7, b_6, \ldots, b_0] M_{\alpha\beta} = [c_7, c_6, \ldots, c_{10}]$$

where $$M_{\alpha\beta} = \begin{bmatrix} 1 & 0 & 1 & 0 & 0 & 0 & 1 & 0 \\ 1 & 0 & 1 & 0 & 1 & 1 & 0 & 1 \\ 0 & 1 & 1 & 0 & 1 & 0 & 1 & 0 \\ 1 & 0 & 1 & 1 & 1 & 0 & 1 & 1 \\ 0 & 1 & 1 & 0 & 0 & 1 & 1 & 0 \\ 1 & 1 & 1 & 0 & 0 & 1 & 0 & 1 \\ 0 & 1 & 1 & 1 & 1 & 0 & 0 & 1 \\ 0 & 0 & 0 & 0 & 0 & 0 & 0 & 1 \end{bmatrix}$$

The inverse field element transformation is the symbol-by-symbol mapping from $GF(2^8)$ defined by $F_G(x)$ to $GF(2^8)$ defined by $F_B(x)$ the symbols to be mapped are decoded word symbols emanating from the ground decoder. The one-to-one mapping is $$\beta^{212i} \rightarrow \alpha^i \text{ or } (\beta^{212i})^{83} \rightarrow (\alpha^i)^{83} = \beta^i \rightarrow \alpha^{83i}$$

Mapping can be done by table look-up or by means of the linear matrix equation $$[c_7, c_6, \ldots, c_{10}] M_{\beta\alpha} = [b_7, b_6, \ldots, b_0]$$

where $$M_{\beta\alpha} = \begin{bmatrix} 1 & 1 & 1 & 0 & 0 & 1 & 0 & 0 \\ 0 & 0 & 0 & 1 & 1 & 1 & 1 & 1 \\ 1 & 0 & 0 & 0 & 1 & 1 & 0 & 1 \\ 1 & 1 & 0 & 0 & 1 & 0 & 1 & 0 \\ 0 & 1 & 0 & 1 & 1 & 0 & 1 & 1 \\ 0 & 1 & 1 & 1 & 0 & 0 & 1 & 1 \\ 1 & 1 & 1 & 0 & 1 & 0 & 0 & 1 \\ 0 & 0 & 0 & 0 & 0 & 0 & 0 & 1 \end{bmatrix}$$

It should be again noted that because of the linearity of the RS codes and the transformations the symbols of a word originating from Code B are $$R_k = C_k + E_k \text{ for } k=0, 1, \ldots, 254$$

and $R_k$ is a linear sum is transformed until the word $R_G$ is obtained. Upon decoding $R_G$, $C_G$ is obtained if the number of erroneous symbols is within the error correction capability of the (255,223) RS code. See Example 15. Symbols in error remain in error after successive forward transformations even if the number of erroneous symbols exceed the error correction capability of the RS code.

Although specific examples have been given of the transformation of the (Berlekamp) code, $C_B$, to a specific conventional code, $C_G$, it should be appreciated that the invention is useful in transforming any (N,K) RS code over $GF(2^J)$ to another (N,K) RS code over $GF(2^J)$. This RS coding for error protection has wide applications in communication channels (from here to there) and storage devices (from now until then), for example, magnetic disc or tape, optical disc, and solid-stage memories.

I claim:

1. A process for realizing mappings between codewords of two distinct (N,K) Reed-Solomon codes over $GF(2^J)$ having selected two independent parameters: J, specifying the number of bits per symbol; and E, the symbol error correction capability of the code, wherein said independent parameters J and E yield the following: $N=2^J-1$, total number of symbols per codeword; 2E, the number of symbols assigned a role of check symbols; and $K=N-2E$, the number of code symbols representing information, all within a codeword of an (N,K) RS code over $GF(2^J)$, and having selected said parameters for encoding, the implementation of a decoder are governed by: $2^J$ field elements defined by a degree J primitive polynomial over GF(2) denoted by F(x); a code generator polynomial of degree 2E containing 2E consecutive roots of a primitive element defined by F(x); and, in a Berlekamp RS code, the basis in which the RS information and check symbols are represented, said process comprising the sequential steps of:

first, symbol-by-symbol conversion due to root power translation of words $R_{B.1}$ of a first RS code B to words $R_{B.2}$, second, permutation of symbols of words $R_{B.2}$ to yield words $R_{B.3}$, third, symbol-by-symbol conversion of words $R_{B.3}$ to words $R_G$ of a second RS code G, fourth, decoding words $R_G$ by correcting erroneous symbols in words $R_G$ using check symbols of each of said words $R_G$ for the information symbols in each word $R_G$ to obtain corrected words $C_G$, and fifth, transformation of said corrected words $C_G$ back to said code B by the inverse of said third, second and first steps in that reverse sequence to convert codewords $C_G$ to codeword $C_{B.3}$, to permute codewords $C_{B.3}$ to yield codewords $C_{B.2}$, and symbol-by-symbol conversion due to root power translation to convert codewords $C_{B.2}$ to codewords $C_{B.1}$.

2. A process as defined in claim 1 wherein said words $R_{B.1}$ of said first code B are defined by a function F(x) wherein said RS symbols are represented in another representation using a parameter $\lambda$ for a field element where 1, $\lambda$, $\lambda^2$, ..., $\lambda^{r-1}$ is a basis in $GF(2^r)$, and said process includes an initial step of converting symbol-to-symbol words $C_B$ of a first basis to said words $R_B$ of a second basis and a final step of said reverse sequence of steps for symbol-to-symbol conversion from said second basis to said first basis of representation using said parameter $\lambda$.

* * * * *